(12) United States Patent
Furue et al.

(10) Patent No.: US 11,650,499 B2
(45) Date of Patent: May 16, 2023

(54) PHOTOSENSITIVE RESIN COMPOSITION, ORGANIC EL ELEMENT BARRIER RIB, AND ORGANIC EL ELEMENT

(71) Applicant: SHOWA DENKO K.K., Tokyo (JP)

(72) Inventors: Kentaro Furue, Tokyo (JP); Yoshikazu Arai, Tokyo (JP)

(73) Assignee: SHOWA DENKO K.K., Tokyo (JP)

( * ) Notice: Subject to any disclaimer, the term of this patent is extended or adjusted under 35 U.S.C. 154(b) by 690 days.

(21) Appl. No.: 16/663,778

(22) Filed: Oct. 25, 2019

(65) Prior Publication Data

US 2020/0249572 A1    Aug. 6, 2020

(30) Foreign Application Priority Data

Feb. 6, 2019 (JP) .............................. JP2019-019507
May 27, 2019 (JP) .............................. JP2019-098601

(51) Int. Cl.
*G03F 7/033* (2006.01)
*G03F 7/004* (2006.01)
*G03F 7/028* (2006.01)

(52) U.S. Cl.
CPC ............ *G03F 7/033* (2013.01); *G03F 7/0045* (2013.01); *G03F 7/028* (2013.01)

(58) Field of Classification Search
CPC ....... G03F 7/0045; G03F 7/039; G03F 7/0392
See application file for complete search history.

(56) References Cited

U.S. PATENT DOCUMENTS

| | | | |
|---|---|---|---|
| 2005/0266341 A1 | 12/2005 | Kim et al. | |
| 2014/0034947 A1 | 2/2014 | Moriguchi et al. | |
| 2018/0253003 A1* | 9/2018 | Furue | ............... G03F 7/0236 |
| 2019/0072851 A1 | 3/2019 | Tanigaki et al. | |
| 2020/0033726 A1 | 1/2020 | Furue et al. | |

FOREIGN PATENT DOCUMENTS

| | | | | |
|---|---|---|---|---|
| JP | 2001-281440 A | | 10/2001 | |
| JP | 2002-116536 A | | 4/2002 | |
| JP | 2009-3442 A | | 1/2009 | |
| JP | 2009-204895 A | | 9/2009 | |
| JP | 2009204895 A | * | 9/2009 | ............ G03F 7/004 |
| JP | 2010-237310 A | | 10/2010 | |
| JP | 2011-203232 A | | 10/2011 | |
| JP | 2013-151705 A | | 8/2013 | |
| JP | 2017181976 A | * | 10/2017 | ............... G02B 5/20 |
| TW | I307450 B | | 3/2009 | |
| WO | 2012/144165 A1 | | 10/2012 | |
| WO | 2014/046062 A1 | | 3/2014 | |
| WO | 2017/069172 A1 | | 4/2017 | |
| WO | WO-2017069172 A1 | * | 4/2017 | ............ G03F 7/023 |
| WO | 2017/159876 A1 | | 9/2017 | |
| WO | 2018/088052 A1 | | 5/2018 | |
| WO | 2018/186494 A1 | | 10/2018 | |

OTHER PUBLICATIONS

English Machine Translation of JP2009204895A (Year: 2009).*
English Machine Translation of JP2017181976A (Year: 2017).*

* cited by examiner

*Primary Examiner* — Duane Smith
*Assistant Examiner* — Nicholas E Brown
(74) *Attorney, Agent, or Firm* — Sughrue Mion, PLLC

(57) ABSTRACT

There is provided a highly sensitive colorant-containing photosensitive resin composition that can form an excellent crack resistant cured product for use in the formation of organic EL element barrier ribs. One embodiment of the photosensitive resin composition for use in organic EL element barrier ribs comprises: (A) a binder resin; (B) a phenolic hydroxyl group-containing compound having a molecular weight of 260 to 5,000 and a phenolic hydroxyl group equivalent of 80 to 155; (C) a radiation sensitive compound; and (D) a colorant selected from the group consisting of black dyes and black pigments.

13 Claims, No Drawings

PHOTOSENSITIVE RESIN COMPOSITION, ORGANIC EL ELEMENT BARRIER RIB, AND ORGANIC EL ELEMENT

FIELD

The present disclosure relates to a photosensitive resin composition for an organic EL element barrier rib, and an organic EL element barrier rib and an organic EL element that use the same. More specifically, the present disclosure relates to a photosensitive resin composition for an organic EL element barrier rib comprising a black colorant, and an organic EL element barrier rib and an organic EL element that use the same.

BACKGROUND

In display devices, such as organic EL displays (OLED), barrier ribs are used in the gaps in the coloring pattern in the display region or the edge of the periphery of the display region in order to improve display properties. When manufacturing organic EL display devices, to ensure that the pixels comprising organic material do not touch each other, barrier ribs are first formed then the pixels comprising the organic material are formed between the barrier ribs. Such barrier ribs are generally formed by photolithography using a photosensitive resin composition and are electrical insulators. More specifically, a photosensitive resin composition is applied onto a substrate using a coating device, and after volatile components are removed by heating, etc., is exposed to light via a mask. Next, unexposed parts, in the case of a negative tone, and exposed parts, in the case of a positive tone, are removed with a developer, such as an aqueous alkaline solution thereby developing the same. The obtained pattern is heat treated and barrier ribs (insulating film) are formed. Next, films of organic material that emit one of three colors, i.e., red, green or blue, are formed between the barrier ribs using an inkjet method, etc., and the pixels of the organic EL display device are formed.

Recently in this field, there is a demand for more compact display devices, and due to the diversification of the content displayed, there is a demand for higher pixel performance and higher resolution. In order to increase the contrast of a display device for the purpose of improving visibility, colorants have been used in order to attempt to impart light shielding properties to the barrier ribs. However, in cases where light shielding properties are imparted to the barrier ribs, there is a tendency for the sensitivity of the photosensitive resin composition to decrease and as a result, there is a risk that the time required for light exposure would increase and productivity would decrease. Thus, photosensitive resin compositions used for forming barrier ribs comprising colorants are required to be highly sensitive.

Patent Literature 1 (Japanese Unexamined Patent Publication (Kokai) No. 2001-281440) describes a composition in which titanium black is added to a positive tone radiation sensitive resin composition comprising an alkali-soluble resin and a quinone diazide compound as a radiation sensitive resin composition exhibiting high light shielding properties by heat treatment after exposure to light.

Patent Literature 2 (Japanese Unexamined Patent Publication (Kokai) No. 2002-116536) describes a method for blackening barrier ribs using carbon black in a radiation sensitive resin composition comprising [A] an alkali-soluble resin, [B] a 1,2-quinone diazide compound, and [C] a colorant.

Patent Literature 3 (Japanese Unexamined Patent Publication (Kokai) No. 2010-237310) describes a composition in which a heat sensitive dye is added to a positive tone radiation sensitive resin composition comprising an alkali-soluble resin and a quinone diazide compound as a radiation sensitive resin composition exhibiting light shielding properties by heat treatment after exposure to light.

CITATION LIST

Patent Literature

[PTL 1] Japanese Unexamined Patent Publication (Kokai) No. 2001-281440

[PTL 2] Japanese Unexamined Patent Publication (Kokai) No. 2002-116536

[PTL 3] Japanese Unexamined Patent Publication (Kokai) No. 2010-237310

SUMMARY

Technical Problem

In order to sufficiently increase the light shielding properties of a cured film of a photosensitive resin composition used for forming a colored barrier rib, a substantial amount of colorant is required. When such a substantial amount of colorant is used, as radiation applied to the coating of the photosensitive resin composition is absorbed by the colorant, the effective strength of the radiation in the coating is diminished, the photosensitive resin composition is not sufficiently exposed to light and as a result, pattern formability is reduced.

When forming barrier ribs for organic EL elements, it is important for the material that forms the barrier rib to be highly sensitive from the standpoint of productivity. However, when a black photosensitive resin composition containing a colorant is used, insufficient light exposure occurs under normally used light exposure conditions and it is necessary, for example, to extend light exposure time, which is a factor in reducing productivity.

In general, ultra-high-pressure mercury lamps that emit g-rays (wavelength 436 nm), h-rays (wavelength 405 nm) and i-rays (wavelength 365 nm) are used on organic EL element barrier ribs wherein the g-, h-, and i-rays are used for light exposure. However, as there are restrictions on the facilities and equipment of manufacturers, there is a demand for the use of only i-rays. As the total amount of energy irradiated is smaller when only i-rays are used for exposure, there is a risk that the reaction rate of a radiation sensitive compound, for example, a photoacid generator, is reduced and, in the development step, there is a risk that insoluble binder resin residue will be generated and a reduction in pattern formability will occur. Thus, it is desirable to further increase the sensitivity of a colorant-containing photosensitive resin composition and increase the flexibility in the use of the radiation for light exposure.

Organic EL element barrier ribs are formed of a comparatively thick film with a film thickness of, for example, 1 to 2 μm. Thus, internal stress may remain in the cured film depending on the type of barrier rib material and curing conditions, whereby cracks may occur. When, for example, each pixel is formed by inkjet printing, etc., using a polymeric organic EL material, cracks that occur in the barrier rib provide a route of material contamination between adjacent pixels, which may lead to a reduction in image quality of an organic EL element. Therefore, there is a desire for a photosensitive resin composition in which the generation of cracks is suppressed when curing.

The present disclosure provides a highly sensitive colorant-containing photosensitive resin composition that can form an excellent crack resistant cured product for use in the formation of organic EL element barrier ribs.

Solution to Problem

The present inventors discovered that by adding a specific phenolic hydroxyl group-containing compound to a colorant-containing photosensitive resin composition, the sensitivity of the photosensitive resin composition can be increased. More specifically, it was discovered that by promoting the dissolution of a binder resin during development, even when low-energy light exposure, such as exposure only to i-rays, is used, excellent alkali developability and pattern formability can be achieved and a cured film in which the generation of cracks is suppressed can be formed.

Specifically, the present disclosure includes the following aspects.

[1]
A photosensitive resin composition for an organic EL element barrier rib comprising:
(A) a binder resin;
(B) a phenolic hydroxyl group-containing compound having a molecular weight of 260 to 5,000 and a phenolic hydroxyl group equivalent of 80 to 155;
(C) a radiation sensitive compound; and
(D) a colorant selected from the group consisting of black dyes and black pigments.

[2]
The photosensitive resin composition according to [1] wherein the molecular weight of the phenolic hydroxyl group-containing compound (B) is 270 to 4,000.

[3]
The photosensitive resin composition according to [1] or [2] wherein the phenolic hydroxyl group-containing compound (B) is at least one selected from the group consisting of tris(4-hydroxyphenyl)methane, 1,1,1-tris(4-hydroxyphenyl)ethane, α,α,α'-tris(4-hydroxyphenyl)-1-ethyl-4-isopropylbenzene, a phenol novolak resin, a cresol novolak resin, a naphthalenediol phenolic resin, a salicylaldehyde phenolic resin, a triphenylmethane phenolic resin, and a biphenylaralkyl phenolic resin.

[4]
The photosensitive resin composition according to any one of [1] to [3] comprising 0.1 parts by mass to 20 parts by mass of the phenolic hydroxyl group-containing compound (B) with respect to 100 parts by mass of the total of the binder resin (A), the phenolic hydroxyl group-containing compound (B), the radiation sensitive compound (C), and the colorant (D).

[5]
The photosensitive resin composition according to any one of [1] to [4] wherein the radiation sensitive compound (C) is at least one photoacid generator selected from the group consisting of quinone diazide compounds, sulfonium salts, phosphonium salts, diazonium salts, and iodonium salts.

[6]
The photosensitive resin composition according to any one of [1] to [5] wherein the binder resin (A) has an alkali-soluble functional group.

[7]
The photosensitive resin composition according to any one of [1] to [6] comprising 1 part by mass to 70 parts by mass of the colorant (D) with respect to 100 parts by mass of the total of the binder resin (A), the phenolic hydroxyl group-containing compound (B), the radiation sensitive compound (C), and the colorant (D).

[8]
The photosensitive resin composition according to any one of [1] to [7] comprising a photoacid generator as 5 parts by mass to 50 parts by mass of the radiation sensitive compound (C) with respect to 100 parts by mass of the total of the binder resin (A), the phenolic hydroxyl group-containing compound (B), the radiation sensitive compound (C), and the colorant (D).

[9]
The photosensitive resin composition according to any one of [1] to [8] wherein the optical density (OD value) of a cured coating of the photosensitive resin composition is at least 0.5 per μm of film thickness.

[10]
The photosensitive resin composition according to any one of [1] to [9] wherein the binder resin (A) comprises at least one selected from the group consisting of:

(a) a polyalkenylphenolic resin having a structural unit represented by formula (1)

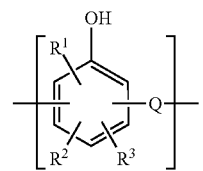

wherein in formula (1), $R^1$, $R^2$, and $R^3$ each independently represent a hydrogen atom; an alkyl group with 1 to 5 carbon atoms; an alkenyl group represented by formula (2)

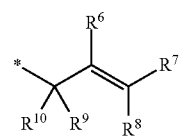

wherein in formula (2), $R^6$, $R^7$, $R^8$, $R^9$, and $R^{10}$ each independently represent a hydrogen atom, an alkyl group with 1 to 5 carbon atoms, a cycloalkyl group with 5 to 10 carbon atoms, or an aryl group with 6 to 12 carbon atoms, the * in formula (2) represents the bond with the carbon atom constituting the aromatic ring; an alkoxy group with 1 or 2 carbon atoms; or a hydroxyl group, and at least one of $R^1$, $R^2$ and $R^3$ is the alkenyl group represented by formula (2), Q is an alkylene group represented by the formula —$CR^4R^5$—, a cycloalkylene group with 5 to 10 carbon atoms, a divalent organic group having an aromatic ring, a divalent organic group having an alicyclic fused ring, or a divalent group consisting of a combination thereof, $R^4$ and $R^5$ each independently represent a hydrogen atom, an alkyl group with 1 to 5 carbon atoms, an alkenyl group with 2 to 6 carbon atoms, a cycloalkyl group with 5 to 10 carbon atoms or an aryl group with 6 to 12 carbon atoms;

(b) a hydroxypolystyrene resin derivative having a structural unit represented by formula (3)

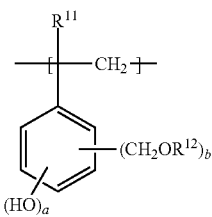

(3)

wherein in formula (3), $R^{11}$ is a hydrogen atom or an alkyl group with 1 to 5 carbon atoms, a is an integer from 1 to 4, b is an integer from 1 to 4, a+b is within the range of 2 to 5, $R^{12}$ is at least one selected from the group consisting of a hydrogen atom, a methyl group, an ethyl group and a propyl group;

(c) an aqueous alkaline solution-soluble resin having an epoxy group and a phenolic hydroxyl group; and (d) an aqueous alkaline solution-soluble copolymer of a polymerizable monomer having an alkali-soluble functional group and an additional polymerizable monomer.

[11]

The photosensitive resin composition according to [10] wherein the binder resin (A) comprises at least one selected from the group consisting of:

(c) an aqueous alkaline solution-soluble resin having an epoxy group and a phenolic hydroxyl group; and (d) an aqueous alkaline solution-soluble copolymer of a polymerizable monomer having an alkali-soluble functional group and an additional polymerizable monomer.

[12]

An organic EL element barrier rib comprising a cured product of the photosensitive resin composition according to any one of [1] to [11].

[13]

An organic EL element comprising a cured product of the photosensitive resin composition according to any one of [1] to [11].

Advantageous Effects of Invention

According to the present disclosure, a highly sensitive colorant-containing photosensitive resin composition that can form an excellent crack resistant cured product for use in the formation of organic EL element barrier ribs can be provided.

DESCRIPTION OF EMBODIMENTS

The present invention will be described in more detail below.

"Alkali-soluble" and "aqueous alkaline solution-soluble" as used herein refer to a photosensitive resin composition or a component thereof, or a coating or cured coating of the photosensitive resin composition that can dissolve in an aqueous alkaline solution, for example, an aqueous solution of 2.38% by mass of tetramethylammonium hydroxide. "Alkali-soluble functional group" refers to a group that imparts such alkali-solubility to a photosensitive resin composition or a component thereof, or a coating or cured coating of the photosensitive resin composition.

"Radical polymerizable functional group" as used herein refers to one or more ethylenically unsaturated groups, and "radical polymerizable compound" refers to a compound having one or more ethylenically unsaturated groups.

"(Meth)acrylic" as used herein refers to acrylic or methacrylic, "(meth)acrylate" refers to acrylate or methacrylate, and "(meth)acryloyl" refers to acryloyl or methacryloyl.

In one embodiment, the photosensitive resin composition comprises: (A) a binder resin; (B) a phenolic hydroxyl group-containing compound having a molecular weight of 260 to 5,000 and a phenolic hydroxyl group equivalent of 80 to 155; (C) a radiation sensitive compound; and (D) a colorant selected from the group consisting of black dyes and black pigments.

[(A) Binder Resin]

Binder resin (A) is not particularly limited but preferably has an alkali-soluble functional group and is alkali soluble. The alkali-soluble functional group is not particularly limited but may be a carboxyl group, a phenolic hydroxyl group, a sulfo group, a phosphoric acid group or a mercapto group. A binder resin comprising two or more alkali-soluble functional groups may be used.

Examples of the binder resin (A) include an acrylic resin, a polystyrene resin, an epoxy resin, a polyamide resin, a phenol resin, a polyimide resin, a polyamic acid resin, a polybenzoxazole resin, a polybenzoxazole resin precursor, a silicone resin, a cyclic olefin polymer, a cardo resin, and resins derived therefrom, and resins obtained by bonding an alkali-soluble functional group thereto. A homopolymer or copolymer of a polymerizable monomer having an alkali-soluble functional group may be used as the binder resin (A). These resins may be used independently or as a combination of two or more types of resin. The binder resin (A) may have a radical polymerizable functional group. In one embodiment, the binder resin (A) has a (meth)acryloyloxy group, an allyl group, or a methallyl group as the radical polymerizable functional group.

In one embodiment, the binder resin (A) comprises at least one selected from the group consisting of the resin components (a) to (k) below.

(a) a polyalkenylphenolic resin with a specific structure (b) a hydroxypolystyrene resin derivative with a specific structure (c) an aqueous alkaline solution-soluble resin having an epoxy group and a phenolic hydroxyl group (d) an aqueous alkaline solution-soluble copolymer of a polymerizable monomer having an alkali-soluble functional group and an additional polymerizable monomer (e) a polyimide resin (f) a polyamic acid resin (g) a polybenzoxazole resin (h) a polybenzoxazole resin precursor (i) a silicone resin (j) a cyclic olefin polymer (k) a cardo resin (a) Polyalkenylphenolic Resin The polyalkenylphenolic resin (a) can be obtained by performing alkenyl etherification of the hydroxyl group of a known phenolic resin then further performing Claisen rearrangement on the alkenyl ether group. In particular, polyalkenylphenolic resins with a structural unit represented by formula (1) are preferable.

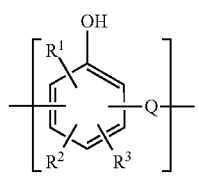

(1)

By including such a resin, the development characteristics are improved and outgassing can be reduced in the obtained photosensitive resin composition.

In formula (1), $R^1$, $R^2$, and $R^3$ each independently represent a hydrogen atom; an alkyl group with 1 to 5 carbon atoms; an alkenyl group represented by formula (2),

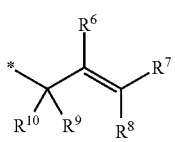

(2)

wherein in formula (2), $R^6$, $R^7$, $R^8$, $R^9$, and $R^{10}$ each independently represent a hydrogen atom, an alkyl group with 1 to 5 carbon atoms, a cycloalkyl group with 5 to 10 carbon atoms, or an aryl group with 6 to 12 carbon atoms, the * in formula (2) represents the bond with the carbon atom constituting the aromatic ring; an alkoxy group with 1 or 2 carbon atoms; or a hydroxyl group, and at least one of $R^1$, $R^2$, and $R^3$ is the alkenyl group represented by formula (2), Q is an alkylene group represented by the formula $-CR^4R^5-$, a cycloalkylene group with 5 to 10 carbon atoms, a divalent organic group having an aromatic ring, a divalent organic group having an alicyclic fused ring, or a divalent group consisting of a combination thereof, $R^4$ and $R^5$ each independently represent a hydrogen atom, an alkyl group with 1 to 5 carbon atoms, an alkenyl group with 2 to 6 carbon atoms, a cycloalkyl group with 5 to 10 carbon atoms or an aryl group with 6 to 12 carbon atoms. When two or more structural units represented by formula (1) are present in one molecule, the structural units represented by formula (1) may be the same or different for each one.

In formula (1), $R^1$, $R^2$, and $R^3$ each independently represent a hydrogen atom, an alkyl group with 1 to 5 carbon atoms, an alkenyl group represented by formula (2), an alkoxy group with 1 or 2 carbon atoms, or a hydroxyl group, and at least one of $R^1$, $R^2$, and $R^3$ is the alkenyl group represented by formula (2). Specific examples of the alkyl group with 1 to 5 carbon atoms represented by $R^1$, $R^2$, or $R^3$ of formula (1) include a methyl group, an ethyl group, an n-propyl group, an isopropyl group, an n-butyl group, a sec-butyl group, a tert-butyl group, and an n-pentyl group. Specific examples of the alkoxy group with 1 or 2 carbon atoms include a methoxy group and an ethoxy group.

$R^6$, $R^7$, $R^8$, $R^9$, and $R^{10}$ in the alkenyl group represented by foiniula (2) each independently represent a hydrogen atom, an alkyl group with 1 to 5 carbon atoms, a cycloalkyl group with 5 to 10 carbon atoms, or an aryl group with 6 to 12 carbon atoms. Specific examples of the alkyl group with 1 to 5 carbon atoms include a methyl group, an ethyl group, an n-propyl group, an isopropyl group, an n-butyl group, a sec-butyl group, a tert-butyl group, and an n-pentyl group. Examples of the cycloalkyl group with 5 to 10 carbon atoms include a cyclopentyl group, a cyclohexyl group, a methylcyclohexyl group, and a cycloheptyl group. Specific examples of the aryl group with 6 to 12 carbon atoms include a phenyl group, a methylphenyl group, an ethylphenyl group, a biphenyl group, and a naphthyl group. It is preferable that $R^6$, $R^7$, $R^8$, $R^9$, and $R^{10}$ each independently represent a hydrogen atom or an alkyl group with 1 to 5 carbon atoms. The alkenyl group represented by formula (2) is preferably an allyl group or a methallyl group from the standpoint of reactivity, and more preferably an allyl group.

It is most preferable that any one of $R^1$, $R^2$, and $R^3$ is an allyl group or a methallyl group, and the other two are hydrogen atoms.

Q of formula (1) is an alkylene group represented by the formula $-CR^4R^5-$, a cycloalkylene group with 5 to 10 carbon atoms, a divalent organic group having an aromatic ring, a divalent organic group having an alicyclic fused ring, or a divalent group consisting of a combination thereof. $R^4$ and $R^5$ each independently represent a hydrogen atom, an alkyl group with 1 to 5 carbon atoms, an alkenyl group with 2 to 6 carbon atoms, a cycloalkyl group with 5 to 10 carbon atoms or an aryl group with 6 to 12 carbon atoms. Specific examples of the alkyl group with 1 to 5 carbon atoms include a methyl group, an ethyl group, an n-propyl group, an isopropyl group, an n-butyl group, a sec-butyl group, a tert-butyl group, and an n-pentyl group. Specific examples of the alkenyl group with 2 to 6 carbon atoms include a vinyl group, an allyl group, a butenyl group, a pentenyl group, and a hexenyl group. Examples of the cycloalkyl group with 5 to 10 carbon atoms include a cyclopentyl group, a cyclohexyl group, a methylcyclohexyl group, and a cycloheptyl group. Specific examples of the aryl group with 6 to 12 carbon atoms include a phenyl group, a methylphenyl group, an ethylphenyl group, a biphenyl group, and a naphthyl group. It is preferable that $R^4$ and $R^5$ each independently represent a hydrogen group or an alkyl group with 1 to 3 carbon atoms and it is most preferable for both to be hydrogen atoms.

Specific examples of the cycloalkylene group with 5 to 10 carbon atoms include a cyclopentylene group, a cyclohexylene group, a methylcyclohexylene group, and a cycloheptylene group. Specific examples of the divalent organic group having an aromatic ring include a phenylene group, a tolylene group, a naphthylene group, a biphenylene group, a fluorenylene group, an anthracenylene group, a xylylene group, a 4,4-methylenediphenyl group and a group represented by formula (6).

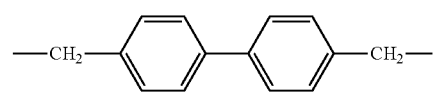

(6)

Specific examples of the divalent organic group having an alicyclic fused ring include a dicyclopentadienylene group.

When the polyalkenylphenolic resin (a) is used as the binder resin (A), in terms of alkali developability, outgassing, etc., a particularly preferable example of the polyalkenylphenolic resin (a) is a polyalkenylphenolic resin having a structural unit represented by formula (1) wherein Q is $-CH_2-$, i.e., by formula (4).

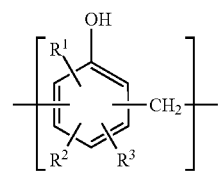

(4)

In formula (4), $R^1$, $R^2$, and $R^3$ are the same as in formula (1). Preferable groups for $R^1$, $R^2$, and $R^3$ are the same as those in formula (1).

The structural unit represented by formula (1) or formula (4) is preferably included in the polyalkenylphenolic resin at 50 mol % to 100 mol %, more preferably 70 mol % to 100 mol % and even more preferably 80 mol % to 100 mol %. At least 50 mol % of the structural unit represented by formula (1) or formula (4) in the polyalkenylphenolic resin (a) is favorable in terms of increasing heat resistance. The phenolic hydroxyl group in the polyalkenylphenolic resin (a) ionizes in the presence of a basic compound, and the polyalkenylphenolic resin becomes soluble in water. Thus, the polyalkenylphenolic resin is necessary to have at least a certain amount of phenolic hydroxyl groups from the standpoint of alkali developability. Accordingly, it is particularly favorable for the polyalkenylphenolic resin (a) having the structural unit represented by formula (4) to be a polyalkenylphenolic resin having a structural unit represented by formula (4) and a structural unit represented by formula (7).

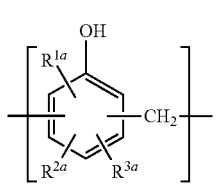

(7)

In formula (7), $R^{1a}$, $R^{2a}$, and $R^{3a}$ each independently represent a hydrogen atom or an alkyl group with 1 to 5 carbon atoms. Preferable groups for $R^{1a}$, $R^{2a}$, and $R^{3a}$ are the same as those for $R^1$, $R^2$, and $R^3$ of formula (1).

In the polyalkenylphenolic resin (a) having a structural unit represented by formula (4) and a structural unit represented by formula (7), when x is the number of structural units represented by formula (4) and y is the number of structural units represented by formula (7), then $0.5 \leq x/(x+y) < 1$, and $0 < y/(x+y) \leq 0.5$, and x+y is preferably 2 to 50, more preferably 3 to 40 and even more preferably 5 to 25.

When a polyalkenylphenolic resin (a) is used as the binder resin (A), the number average molecular weight of the polyalkenylphenolic resin (a) is preferably 500 to 5,000, more preferably 800 to 3,000, and even more preferably 900 to 2,000. The weight average molecular weight of the polyalkenylphenolic resin (a) is preferably 500 to 30,000, more preferably 3,000 to 25,000, and even more preferably 5,000 to 20,000. Provided the weight average molecular weight and the number average molecular weight are within these ranges, a photosensitive resin composition with excellent alkali solubility and developability can be obtained. Herein, the number average molecular weight and the weight average molecular weight of the binder resin (A) are measured by gel permeation chromatography (GPC) in terms of standard polystyrene equivalents.

(b) Hydroxypolystyrene Resin Derivative

A hydroxypolystyrene resin derivative (b) having a structural unit represented by formula (3) can also be used for the binder resin (A).

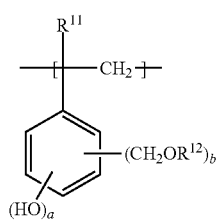

(3)

The inclusion of such a resin improves the development characteristics of the photosensitive resin composition and can also contribute to the reduction of outgassing thereof.

In formula (3), $R^{11}$ represents a hydrogen atom or an alkyl group with 1 to 5 carbon atoms, a is an integer from 1 to 4, b is an integer from 1 to 4, a+b is in the range of 2 to 5, and $R^{12}$ is at least one selected from the group consisting of a hydrogen atom, a methyl group, an ethyl group, and a propyl group.

When a hydroxypolystyrene resin derivative (b) is used as the binder resin (A), a copolymer having a structural unit represented by formula (3) and a structural unit represented by formula (5) is preferable in terms of alkali developability and outgassing.

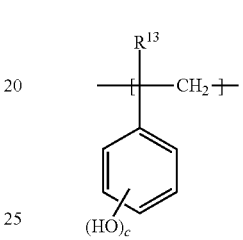

(5)

In formula (5), $R^{13}$ represents a hydrogen atom or an alkyl group with 1 to 5 carbon atoms and c is an integer from 1 to 5.

The hydroxypolystyrene resin derivative (b) having a structural unit represented by formula (3) and the hydroxypolystyrene resin derivative (b) having a structural unit represented by formula (3) and a structural unit represented by formula (5) can be obtained by, for example, polymerizing, using a publicly-known method, one or more phenolic hydroxyl group-containing aromatic vinyl compounds, such as p-hydroxystyrene, m-hydroxystyrene, o-hydroxystyrene, p-isopropenylphenol, m-isopropenylphenol, and o-isopropenylphenol, then reacting a portion of the obtained polymer or copolymer with formaldehyde using a publicly-known method, for example, the method disclosed in Japanese Unexamined Patent Publication (Kokai) No. 2013-151705, or by further reacting with an alcohol.

p-Hydroxystyrene or m-hydroxystyrene may be favorably used for the phenolic hydroxyl group-containing aromatic vinyl compound.

When a hydroxypolystyrene resin derivative (b) is used as the binder resin (A), the number average molecular weight of the hydroxypolystyrene resin derivative (b) is preferably 1,000 to 20,000, more preferably 3,000 to 10,000, and even more preferably 4,000 to 9,000. The weight average molecular weight of the hydroxypolystyrene resin derivative (b) is preferably 1,000 to 100,000, more preferably 5,000 to 75,000, and even more preferably 10,000 to 50,000. Provided the weight average molecular weight and the number average molecular weight are within these ranges, a photosensitive resin composition with excellent alkali solubility, developability, and coatability can be obtained.

(c) Aqueous Alkaline Solution-Soluble Resin Having an Epoxy Group and a Phenolic Hydroxyl Group An aqueous alkaline solution-soluble resin having an epoxy group and a phenolic hydroxyl group (c) may be used as the binder resin (A). Such an aqueous alkaline solution-soluble resin can be obtained by, for example, reacting an epoxy group of a compound having at least two epoxy groups per molecule (hereinafter may be referred to as "epoxy compound") with the carboxyl group of a hydroxybenzoic acid compound. By having epoxy groups in the aqueous alkaline solution-soluble resin, crosslinking is formed during heating by reacting the epoxy groups with a phenolic hydroxyl group, whereby chemical resistance, heat resistance, etc., of the coating can be improved. The phenolic hydroxyl groups contribute to solubility in an aqueous alkaline solution during development.

The following reaction formula 1 is an example of the reaction between one epoxy group of an epoxy compound and the carboxyl group of a hydroxybenzoic acid compound to form a phenolic hydroxyl group-containing compound.

Reaction formula 1

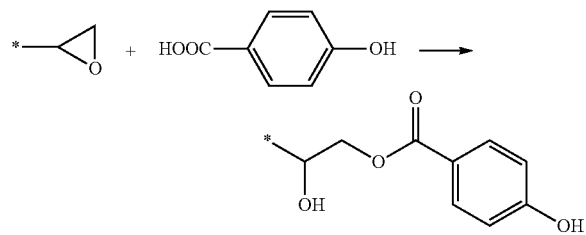

Examples of the compound having at least two epoxy groups per molecule may include an epoxy phenol novolak resin, an epoxy cresol novolak resin, a bisphenol epoxy resin, a biphenol epoxy resin, a naphthalene skeleton-containing epoxy resin, an alicyclic epoxy resin, and a heterocyclic epoxy resin. These epoxy compounds are acceptable provided there are at least two epoxy groups per molecule and may be used individually or in combination of two or more thereof. As these are thermosetting compounds, the structures thereof cannot be unambiguously defined due to differences, such as the presence or absence of epoxy groups, the type of functional groups, and the degree of polymerization, as is common knowledge for a person skilled in the art. One example of the structure of the epoxy novolak resin is illustrated in formula (9). In formula (9), $R^{14}$ represents, for example, a hydrogen atom, an alkyl group with 1 to 5 carbon atoms, an alkoxy group with 1 or 2 carbon atoms or a hydroxyl group, and m is an integer from 1 to 50.

(9)

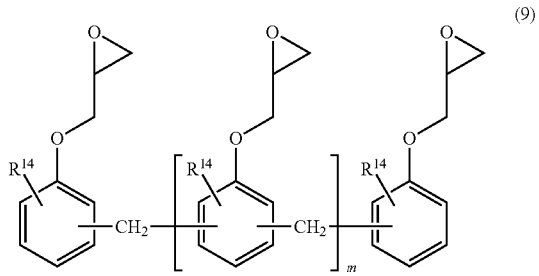

The epoxy phenol novolak resin may be, for example, EPICLON® N-770 (DIC Corporation) or jER®-152 (Mitsubishi Chemical Corporation). The epoxy cresol novolak resin may be, for example, EPICLON® N-695 (DIC Corporation) or EOCN®-102S (Nippon Kayaku Co., Ltd.). The bisphenol epoxy resin may be, for example, a bisphenol-A epoxy resin, such as jER® 828, jER® 1001 (Mitsubishi Chemical Corporation) and YD-128 (trade name, Nippon Steel & Sumikin Chemical Co., Ltd.), or a bisphenol-F epoxy resin, such as jER® 806 (Mitsubishi Chemical Corporation) or YDF-170 (trade name, Nippon Steel & Sumikin Chemical Co., Ltd.). The biphenol epoxy resin may be, for example, jER® YX-4000 or jER® YL-6121H (Mitsubishi Chemical Corporation). The naphthalene skeleton-containing epoxy resin may be, for example, NC-7000 (trade name, Nippon Kayaku Co., Ltd.) or EXA-4750 (trade name, DIC Corporation). The alicyclic epoxy resin may be, for example, EHPE®-3150 (Daicel Corporation). The heterocyclic epoxy resin may be, for example, TEPIC®, TEPIC-L, TEPIC-H, or TEPIC-S (Nissan Chemical Corporation).

It is preferable for the compound having at least two epoxy groups per molecule to be an epoxy cresol novolak resin. Photosensitive resin compositions including an aqueous alkaline solution-soluble resin having an epoxy group and a phenolic hydroxyl group (c), the resin derived from an epoxy cresol novolak resin, have excellent pattern formability and readily adjustable alkali solubility, and exhibit little outgassing.

The hydroxybenzoic acid compound is a compound in which at least one of positions 2 to 6 of benzoic acid has been substituted with a hydroxyl group. Examples thereof include salicylic acid, 4-hydroxybenzoic acid, 2,3-dihydroxybenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-hydroxy-5-nitrobenzoic acid, 3-hydroxy-4-nitrobenzoic acid, and 4-hydroxy-3-nitrobenzoic acid. From the standpoint of increasing alkali developability, dihydroxybenzoic acid compounds are preferable. These hydroxybenzoic acid compounds may be used individually or in a combination of two or more.

In one embodiment, the aqueous alkaline solution-soluble resin having an epoxy group and a phenolic hydroxyl group (c) is the reaction product of a compound having at least two epoxy groups per molecule and a hydroxybenzoic acid compound and has a structure represented by formula (8).

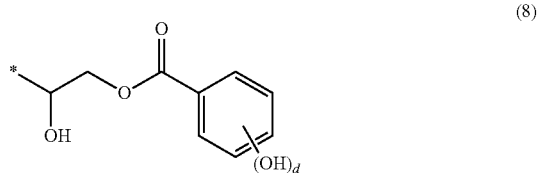

(8)

In formula (8), d is an integer from 1 to 5, * represents the bonding part to the residue derived by removing an epoxy group of the compound having at least two epoxy groups per molecule.

In a method for obtaining an aqueous alkaline solution-soluble resin having an epoxy group and a phenolic hydroxyl group (c) from an epoxy compound and a hydroxybenzoic acid compound, with respect to one equivalent of epoxy groups of the epoxy compound, 0.2 to 1.0 equivalents of the hydroxybenzoic acid compound may be used, preferably 0.3 to 0.9 equivalents, and more preferably 0.4 to 0.8 equivalents. Sufficient alkali solubility can be attained with 0.2 equivalents or more of the hydroxybenzoic acid compound and the increase in molecular weight due to side reactions can be suppressed with 1.0 equivalents or less.

A catalyst may be used to promote the reaction between the epoxy compound and the hydroxybenzoic acid compound. With respect to 100 parts by mass of the mixture of reactants including the epoxy compound and the hydroxybenzoic acid compound, the amount of catalyst to be used may be 0.1 to 10 parts by mass. The reaction temperature may be set to 60 to 150° C. and the reaction time may be set to 3 to 30 hours. The catalyst for use in this reaction may be, for example, triethylamine, benzyldimethylamine, triethylammonium chloride, benzyltrimethylammonium bromide, benzyltrimethylammonium iodide, triphenylphosphine, chromium octanoate, or zirconium octanoate.

The aqueous alkaline solution-soluble resin having an epoxy group and a phenolic hydroxyl group (c) has a number average molecular weight of preferably 500 to 8,000, more preferably 800 to 6,000, and even more preferably 1,000 to 5,000. Provided the number average molecular weight is at least 500, the alkali solubility is appropriate and so the use of the resin as a photosensitive material is favorable, and provided the number average molecular weight is 8,000 or less, the coatability and developability are good.

(d) Aqueous Alkaline Solution-Soluble Copolymer of a Polymerizable Monomer Having an Alkali-Soluble Functional Group and an Additional Polymerizable Monomer An aqueous alkaline solution-soluble copolymer of a polymerizable monomer having an alkali-soluble functional group and an additional polymerizable monomer (d) may be used for the binder resin (A). The alkali-soluble functional group may be a carboxyl group, an alcoholic hydroxyl group, a phenolic hydroxyl group, a sulfo group, a phosphoric acid group, an acid anhydride group, etc. The polymerizable functional group of the polymerizable monomer may be a radical polymerizable functional group, such as $CH_2=CH-$, $CH_2=C(CH_3)-$, $CH_2=CHCO-$, $CH_2=C(CH_3)CO-$, or $-OC-CH=CH-CO-$.

The aqueous alkaline solution-soluble copolymer of a polymerizable monomer having an alkali-soluble functional group and an additional polymerizable monomer (d) can be produced by, for example, the radical polymerization of a polymerizable monomer having an alkali-soluble functional group and an additional polymerizable monomer. A derivative obtained by synthesizing a copolymer by radical polymerization and thereafter adding an alkali-soluble functional group thereto may be used. The polymerizable monomer having an alkali-soluble functional group may be, for example, 4-hydroxystyrene, (meth)acrylic acid, α-bromo (meth)acrylic acid, α-chloro(meth)acrylic acid, β-furyl (meth)acrylic acid, β-styryl(meth)acrylic acid, maleic acid, monomethyl maleate, monoethyl maleate, monoisopropyl maleate, fumaric acid, cinnamic acid, α-cyanocinnamic acid, itaconic acid, crotonic acid, propiolic acid, 4-hydroxyphenyl methacrylate, 3,5-dimethyl-4-hydroxybenzyl acrylamide, 4-hydroxyphenyl acrylamide, 4-hydroxyphenyl maleimide, 3-maleimidopropionic acid, 4-maleimidobutyric acid, or 6-maleimidohexanoic acid. The additional polymerizable monomer may be, for example, a polymerizable styrene derivative, such as styrene, vinyl toluene, α-methylstyrene, p-methylstyrene, or p-ethylstyrene; acrylamide; acrylonitrile; an ether compound of vinyl alcohol, such as vinyl n-butyl ether; a (meth)acrylic acid ester, such as alkyl (meth)acrylate, tetrahydrofurfuryl (meth)acrylate, dimethylaminoethyl (meth)acrylate, diethylaminoethyl (meth)acrylate, glycidyl (meth)acrylate, 2,2,2-trifluoroethyl (meth) acrylate, 2,2,3,3-tetrafluoropropyl (meth)acrylate, or isobornyl(meth)acrylate; maleic anhydride; maleic acid monoester; or an N-substituted maleimide, such as phenylmaleimide, or cyclohexyl maleimide. From the standpoint of heat resistance, the aqueous alkaline solution-soluble copolymer of a polymerizable monomer having an alkali-soluble functional group and an additional polymerizable monomer (d) preferably has one or more cyclic structures, such as an alicyclic structure, an aromatic structure, a polycyclic structure, an inorganic cyclic structure, or a heterocyclic structure.

The polymerizable monomer having an alkali-soluble functional group preferably forms the structural unit represented by formula (10).

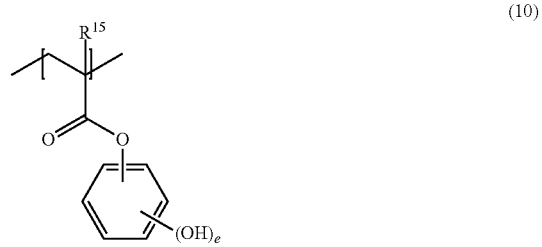

(10)

In formula (10), $R^{15}$ represents a hydrogen atom or an alkyl group with 1 to 5 carbon atoms and e is an integer from 1 to 5. 4-Hydroxyphenyl methacrylate is particularly preferable for the polymerizable monomer having an alkali-soluble functional group.

The additional polymerizable monomer may be a styrene-based monomer, an alkyl (meth)acrylate, etc. In particular, a polymerizable monomer forming a structural unit represented by formula (11) is preferable.

(11)

In formula (11), $R^{16}$ and $R^{17}$ each independently represent a hydrogen atom, an alkyl group with 1 to 3 carbon atoms, a fully or partially fluorinated alkyl group with 1 to 3 carbon atoms, or a halogen atom. $R^{18}$ represents a hydrogen atom, a linear or cyclic alkyl group with 1 to 6 carbon atoms, or a phenyl group, or represents a phenyl group substituted with at least one selected from the group consisting of a hydroxyl group, an alkyl group with 1 to 6 carbon atoms, and an alkoxy group with 1 to 6 carbon atoms. It is preferable for $R^{16}$ and $R^{17}$ to be hydrogen atoms. It is preferable for $R^{18}$ to be a cyclic alkyl group with 1 to 6 carbon atoms or a phenyl group. From such additional polymerizable monomers, phenyl maleimide and cyclohexyl maleimide are particularly preferable.

In one embodiment, the aqueous alkaline solution-soluble copolymer of a polymerizable monomer having an alkali-soluble functional group and an additional polymerizable monomer (d) has a structural unit represented by formula (10)

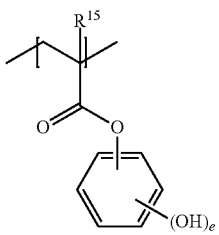

(10)

wherein in formula (10), $R^{15}$ is a hydrogen atom or an alky group with 1 to 5 carbon atoms and e is an integer from 1 to 5, and a structural unit represented by formula (11)

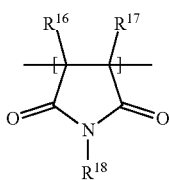

(11)

wherein in formula (11), $R^{16}$ and $R^{17}$ each independently represent a hydrogen atom, an alkyl group with 1 to 3 carbon atoms, a fully or partially fluorinated alkyl group with 1 to 3 carbon atoms, or a halogen atom, and $R^{18}$ represents a hydrogen atom, a linear or cyclic alkyl group with 1 to 6 carbon atoms or a phenyl group, or represents a phenyl group substituted with at least one selected from the group consisting of a hydroxyl group, an alkyl group with 1 to 6 carbon atoms, and an alkoxy group with 1 to 6 carbon atoms.

The use of 4-hydroxyphenyl methacrylate for the polymerizable monomer having an alkali-soluble functional group together with the use of phenyl maleimide or cyclohexyl maleimide for the additional polymerizable monomer is particularly preferable. By using a resin in which these polymerizable monomers are radically polymerized, shape retainability and developability can be improved and outgassing can be reduced.

A polymerization initiator used when producing the aqueous alkaline solution-soluble copolymer of a polymerizable monomer having an alkali-soluble functional group and an additional polymerizable monomer (d) by radical polymerization may be, but not limited to, an azo polymerization initiator, such as 2,2'-azobisisobutyronitrile, 2,2'-azobis(2-methylbutyronitrile), dimethyl 2,2'-azobis(2-methylpropionate), 4,4'-azobis(4-cyanovaleric acid), or 2,2'-azobis(2,4-dimethyl valeronitrile) (AVN); a peroxide polymerization initiator with a 10 hour half-life temperature of 100 to 170° C., such as dicumyl peroxide, 2,5-dimethyl-2,5-di(tert-butylperoxy)hexane, tert-butylcumyl peroxide, di-tert-butyl peroxide, 1,1,3,3-tetramethyl butyl hydroperoxide, or cumene hydroperoxide; or a peroxide polymerization initiator, such as benzoyl peroxide, lauroyl peroxide, 1,1'-di(tert-butylperoxy)cyclohexane, or tert-butyl peroxypivalate. The amount of the polymerization initiator used with respect to 100 parts by mass of the polymerizable monomer mixture is, in general, preferably 0.01 parts by mass or more, 0.05 parts by mass or more, or 0.5 parts by mass or more, and 40 parts by mass or less, 20 parts by mass or less, or 15 parts by mass or less.

A RAFT (Reversible Addition Fragmentation Transfer) agent may be used in combination with the polymerization initiator. The RAFT agent may be, but is not limited to, a thiocarbonylthio compound, such as a dithioester, a dithiocarbamate, a trithiocarbonate, or a xanthate. With respect to 100 parts by mass of the total of the polymerizable monomers, the RAFT agent may be used in a range of 0.005 to 20 parts by mass, and preferably in the range of 0.01 to 10 parts by mass.

The weight average molecular weight (Mw) of the aqueous alkaline solution-soluble copolymer of a polymerizable monomer having an alkali-soluble functional group and an additional polymerizable monomer (d) may be 3,000 to 80,000, preferably 4,000 to 70,000, and more preferably 5,000 to 60,000. The number average molecular weight (Mn) may be 1,000 to 30,000, preferably 1,500 to 25,000 and more preferably 2,000 to 20,000. The polydispersity index (Mw/Mn) may be 1.0 to 3.5, preferably 1.1 to 3.0, more preferably 1.2 to 2.8. Provided the weight average molecular weight, the number average molecular weight, and the polydispersity index are within the aforementioned ranges, a photosensitive resin composition with excellent alkali solubility and developability can be obtained.

Herein, if the aqueous alkaline solution-soluble copolymer of a polymerizable monomer having an alkali-soluble functional group and an additional polymerizable monomer (d) also corresponds to the hydroxypolystyrene resin derivative (b), the same is considered as the aqueous alkaline solution-soluble copolymer of a polymerizable monomer having an alkali-soluble functional group and an additional polymerizable monomer (d). If the aqueous alkaline solution-soluble copolymer of a polymerizable monomer having an alkali-soluble functional group and an additional polymerizable monomer (d) also corresponds to the aqueous alkaline solution-soluble resin having an epoxy group and a phenolic hydroxyl group (c), the same is considered as the aqueous alkaline solution-soluble copolymer of a polymerizable monomer having an alkali-soluble functional group and an additional polymerizable monomer (d). In other words, the hydroxypolystyrene resin derivative (b) and the aqueous alkaline solution-soluble resin having an epoxy group and a phenolic hydroxyl group (c) exclude those that correspond to the aqueous alkaline solution-soluble copolymer of a polymerizable monomer having an alkali-soluble functional group and an additional polymerizable monomer (d).

(e) Polyimide Resin, (f) Polyamic Acid Resin, (g) Polybenzoxazole Resin and (h) Polybenzoxazole Resin Precursor In one embodiment, the binder resin (A) is at least one selected from the group consisting of a polyimide resin (e), a polyamic acid resin (f), a polybenzoxazole resin (g), and a polybenzoxazole resin precursor (h). The dehydration and ring closure of the polyamic acid resin (f) results in the formation of a resin having a polyimide structure. The dehydration and ring closure of the polybenzoxazole resin precursor (h) results in the formation of a polybenzoxazole resin (g).

The polyimide resin (e) has a structural unit represented by formula (12). The polyamic acid resin (f) and the polybenzoxazole resin precursor (h) have a structural unit represented by formula (13). The polybenzoxazole resin (g) has a structural unit represented by formula (14). The polyimide resin (e) may have both the structural unit represented by formula (12) and the structural unit represented by formula (13), and the polybenzoxazole resin (g) may have both the structural unit represented by formula (14) and the structural unit represented by formula (13).

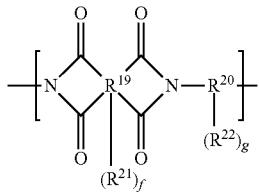

(12)

In formula (12), $R^{19}$ represents a 4 to 10 valence organic group, $R^{20}$ represents a 2 to 8 valence organic group, and $R^{21}$ and $R^{22}$ each independently represent a hydroxyl group, a carboxyl group, a sulfo group or a mercapto group, and f and g are each independently an integer from 0 to 6.

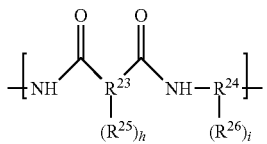

(13)

In formula (13), $R^{23}$ represents a 2 to 8 valence organic group, $R^{24}$ represents a 2 to 8 valence organic group, $R^{25}$ and $R^{26}$ each independently represent a hydroxyl group, a sulfo group, a mercapto group, or —$COOR^{27}$ where $R^{27}$ represents a hydrogen atom or a monovalent hydrocarbon group with 1 to 20 carbon atoms, and h and i are each independently an integer from 0 to 6, provided that h+i>0. In the case of a polyamic acid resin (f), h is an integer of 1 or more and at least one $R^{25}$ is —$COOR^{27}$. In the case of a polybenzoxazole resin precursor (h), i is an integer of 1 or more and at least one $R^{26}$ is a phenolic hydroxyl group.

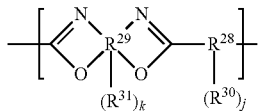

(14)

In formula (14), $R^{28}$ represents a 2 to 8 valence organic group, $R^{29}$ represents a 2 to 8 valence organic group, and $R^{30}$ and $R^{31}$ each independently represent a hydroxyl group, a carboxyl group, a sulfo group or a mercapto group, and j and k are each independently an integer from 0 to 6.

$R^{19}$-$(R^{21})_f$ of formula (12) represent an acid dianhydride residue. $R^{19}$ is a 4 to 10 valence organic group and is preferably an aromatic ring- or a cyclic aliphatic group-containing organic group with 5 to 40 carbon atoms.

The acid dianhydride may be, for example: an aromatic tetracarboxylic acid dianhydride, such as pyromellitic dianhydride, 3,3',4,4'-biphenyltetracarboxylic acid dianhydride, 2,3,3',4'-biphenyltetracarboxylic dianhydride, 2,2',3,3'-biphenyltetracarboxylic acid dianhydride, 3,3',4,4'-benzophenonetetracarboxylic acid dianhydride, 2,2',3,3'-benzophenonetetracarboxylic acid dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl) ether dianhydride, 1,2,5,6-naphthalenetetracarboxylic dianhydride, 9,9-bis(3,4-dicarboxyphenyl)fluorene dianhydride, 9,9-bis[4-(3,4-dicarboxyphenoxy)phenyl]fluorene dianhydride, 2,3,6,7-naphthalenetetracarboxylic acid dianhydride, 2,3,5,6-pyridinetetracarboxylic acid dianhydride, 3,4,9,10-perylenetetracarboxylic acid dianhydride, or 2,2-bis(3,4-dicarboxyphenyl)hexafluoropropane dianhydride; an aliphatic tetracarboxylic acid dianhydride, such as butanetetracarboxylic acid dianhydride, or 1,2,3,4-cyclopentanetetracarboxylic acid dianhydride; or a combination of two or more thereof.

$R^{23}$-$(R^{25})_h$ of formula (13) and $R^{28}$-$(R^{30})_j$ of formula (14) each represent an acid residue. $R^{23}$ and $R^{28}$ each independently represent a 2 to 8 valence organic group and are each preferably an aromatic ring- or cyclic aliphatic group-containing organic group with 5 to 40 carbon atoms.

The acid may be, for example: an aromatic dicarboxylic acid, such as terephthalic acid, isophthalic acid, diphenyl ether dicarboxylic acid, bis(carboxyphenyl)hexafluoropropane, biphenyl dicarboxylic acid, benzophenone dicarboxylic acid, or triphenyl dicarboxylic acid; an aromatic tricarboxylic acid, such as trimellitic acid, trimesic acid, diphenyl ether tricarboxylic acid, or biphenyl tricarboxylic acid; an aromatic tetracarboxylic acid, such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl) ether, 1,2,5,6-naphthalenetetracarboxylic acid, 2,3,6,7-naphthalenetetracarboxylic acid, 2,3,5,6-pyridinetetracarboxylic acid, or 3,4,9,10-perylenetetracarboxylic acid; or an aliphatic tetracarboxylic acid, such as butanetetracarboxylic acid, or 1,2,3,4-cyclopentanetetracarboxylic acid; or a combination of two or more thereof. In the aforementioned tricarboxylic acids and tetracarboxylic acids, one or two carboxyl groups correspond to $R^{25}$ of formula (13) and $R^{30}$ of formula (14). These acids may take the form of esters or acid anhydrides.

$R^{20}$-$(R^{22})_g$ of formula (12), $R^{24}$-$(R^{26})_i$ of formula (13), $R^{29}$-$(R^{31})_k$ of formula (14) each represent a diamine residue. $R^{20}$, $R^{24}$, and $R^{29}$ each independently represent a 2 to 8 valence organic group, preferably containing an aromatic ring or a cyclic aliphatic group and having 5 to 40 carbon atoms.

The diamine corresponding to $R^{20}$ of formula (12) or $R^{24}$ of formula (13) which is related to the polyamic acid resin (f) may be, for example: an aromatic diamine, such as 3,4'-diaminodiphenyl ether, 4,4'-diaminodiphenyl ether, 3,4'-diaminodiphenylmethane, 4,4'-diaminodiphenylmethane, 1,4-bis(4-aminophenoxy)benzene, benzidine, m-phenylenediamine, p-phenylenediamine, 1,5-naphthalenediamine, 2,6-naphthalenediamine, bis(4-aminophenoxy)biphenyl, bis[4-(4-aminophenoxy)phenyl] ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, or 9,9-bis(4-aminophenyl)fluorene; a compound obtained by substituting at least one hydrogen atom on the aromatic ring of the aromatic diamine with an alkyl group or a halogen atom; an aliphatic diamine, such as cyclohexyldiamine or methylene biscyclohexylamine; or a combination of two or more thereof.

The diamine corresponding to $R^{24}$ of formula (13) related to the polybenzoxazole resin precursor (h), and $R^{29}$ of formula (14) may be, for example, a bisaminophenol compound having a phenolic hydroxyl group at the ortho position with respect to the amino group on the aromatic ring of the aforementioned aromatic diamine or a combination of two or more thereof.

The terminal of the polyimide resin (e), polyamic acid resin (f), polybenzoxazole resin (g), and polybenzoxazole resin precursor (h) may be capped with a monoamine, acid anhydride, acid chloride or monocarboxylic acid having an acidic group so that these resins have an acidic group at the terminal of the main chain thereof.

The polyamic acid resin (f) may be synthesized by, for example: a method in which a tetracarboxylic acid dianhydride and a diamine are reacted; a method in which a diester is formed from a tetracarboxylic acid dianhydride and an alcohol and thereafter the diester is reacted with a diamine in the presence of a condensing agent; or a method in which a diester is formed from the tetracarboxylic acid dianhydride and alcohol, the remaining dicarboxylic acid is reacted to form acid chloride, and the obtained intermediate is reacted with a diamine.

The polybenzoxazole resin precursor (h) can be synthesized by, for example, a condensation reaction in which a bisaminophenol compound is reacted with a polycarboxylic acid, such as a dicarboxylic acid, a tricarboxylic acid, or a tetracarboxylic acid. Specific examples include: a method in which an intermediate obtained by reacting a dehydrating condensing agent, such as dicyclohexyl carbodiimide (DCC), with a polycarboxylic acid, is reacted with a bisaminophenol compound; and a method in which a dicarboxylic acid dichloride solution is dripped into a solution of a bisaminophenol compound to which a tertiary amine, such as pyridine, is added.

The polyimide resin (e) can be synthesized by, for example, the dehydration and ring closure of the polyamic acid resin (f), which has been obtained by the aforementioned method, by heating or chemical treatment thereof with an acid, a base, etc.

The polybenzoxazole resin (g) can be synthesized by, for example, the dehydration and ring closure of the polybenzoxazole resin precursor (h), which has been obtained by the aforementioned method, by heating or chemical treatment thereof with an acid, a base, etc.

The number average molecular weight of each of the polyimide resin (e), polyamic acid resin (f), polybenzoxazole resin (g), and polybenzoxazole resin precursor (h) is preferably 500 to 8,000, more preferably 800 to 6,000, and even more preferably 1,000 to 5,000. Provided the number average molecular weight is at least 500, the use of the resin as a photosensitive material is favorable as the alkali solubility is suitable, and provided the number average molecular weight is 8,000 or less, the coatability and developability are good.

(i) Silicone Resin

In one embodiment, the binder resin (A) includes a silicone resin (i). The silicone resin (i) can be synthesized by the hydrolytic condensation of at least one compound selected from the group consisting of an organosilane represented by formula (15) and an organosilane represented by formula (16). By using the organosilanes represented by formula (15) or formula (16), a photosensitive resin composition with excellent sensitivity and resolution can be obtained.

The organosilane represented by formula (15) is shown below.

$(R^{32})_p Si(OR^{33})_{4-p}$ (15)

In formula (15), $R^{32}$ represents a hydrogen atom, an alkyl group with 1 to 10 carbon atoms, an alkenyl group with 2 to 10 carbon atoms, or an aryl group with 6 to 16 carbon atoms; $R^{33}$ represents a hydrogen atom, an alkyl group with 1 to 6 carbon atoms, an acyl group with 2 to 6 carbon atoms, or an aryl group with 6 to 16 carbon atoms; and p is an integer of 0 to 3. When p is two or more, the plurality of $R^{32}$s may each be the same or different. When p is two or less, the plurality of $R^{33}$s may each be the same or different.

The organosilane represented by formula (15) may be, for example, a tetrafunctional silane, such as tetramethoxysilane, tetraethoxysilane, tetraacetoxysilane, or tetraphenoxysilane; a trifunctional silane, such as methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, [(3-ethyl-3-oxetanyl)methoxy]propyltrimethoxysilane, [(3-ethyl-3-oxetanyl)methoxy]propyltriethoxysilane, 3-mercaptopropyltrimethoxysilane, 3-trimethoxysilylpropylsuccinic acid, 1-naphthyltrimethoxysilane, 1-naphthyltriethoxysilane, 1-naphthyltri-n-propoxysilane, 2-naphthyltrimethoxysilane, 1-anthracenyltrimethoxysilane, 9-anthracenyltrimethoxysilane, 9-phenanthrenyltrimethoxysilane, 9-fluorenyltrimethoxysilane, 2-fluorenyltrimethoxysilane, 1-pyrenyltrimethoxysilane, 2-indenyltrimethoxysilane, or 5-acenaphthenyltrimethoxysilane; a bifunctional silane, such as dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, di(1-naphthyl)dimethoxysilane, di(1-naphthyl)diethoxysilane; a monofunctional silane, such as trimethylmethoxysilane, tri-n-butylethoxysilane, (3-glycidoxypropyl)dimethylmethoxysilane, or (3-glycidoxypropyl)dimethylethoxysilane; or a combination of two or more thereof.

The organosilane represented by formula (16) is shown below.

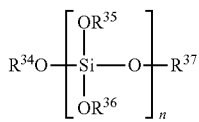 (16)

In formula (16), $R^{34}$ to $R^{37}$ each independently represent a hydrogen atom, an alkyl group with 1 to 6 carbon atoms, an acyl group with 2 to 6 carbon atoms or an aryl group with 6 to 16 carbon atoms, and n is in the range of 2 to 8. When n is two or more, the plurality of $R^{35}$s and $R^{36}$s may be the same or different.

Specific examples of the organosilane represented by formula (16) include: methyl silicate 51 ($R^{34}$ to $R^{37}$ are methyl groups and n is an average of 4) manufactured by Fuso Chemical Co., Ltd; M silicate 51 ($R^{34}$ to $R^{37}$ are methyl groups and n is an average of 3 to 5), silicate 40 ($R^{34}$ to $R^{37}$ are ethyl groups and n is an average of 4 to 6), and silicate 45 ($R^{34}$ to $R^{37}$ are ethyl groups and n is an average of 6 to 8) manufactured by Tama Chemicals Co., Ltd.; and methyl silicate 51 ($R^{34}$ to $R^{37}$ are methyl groups and n is an average of 4), methyl silicate 53A ($R^{34}$ to $R^{37}$ are methyl groups and n is an average of 7), and ethyl silicate 40 ($R^{34}$ to $R^{37}$ are ethyl groups and n is an average of 5) manufactured by Colcoat Co., Ltd. A combination of two or more thereof may also be used.

The silicone resin (i) can be synthesized by the hydrolysis and partial condensation of the organosilanes represented by formula (15) or formula (16). Partial condensation results in residual silanol groups being present in the silicone resin (i). Hydrolysis and partial condensation can be carried out by, for example, a method in which a solvent, water, a catalyst, etc., are added as necessary to the organosilane mixture which is then heated and stirred at a temperature of 50 to 150° C. for 0.5 to 100 hours. By-products of hydrolysis (alcohols, such as methanol) or by-products of condensation (water) may be evaporated off by distillation.

An acidic or basic catalyst is preferably used for the catalyst. The acidic catalyst may be, for example, hydrochloric acid, nitric acid, sulfuric acid, hydrofluoric acid, phosphoric acid, acetic acid, trifluoroacetic acid, formic acid, a polycarboxylic acid or an anhydride thereof, or an ion exchange resin. The basic catalyst may be, for example, triethylamine, tripropylamine, tributylamine, tripentylamine, trihexylamine, triheptylamine, trioctylamine, diethylamine, triethanolamine, diethanolamine, sodium hydroxide, potassium hydroxide, an alkoxysilane having an amino group, or an ion exchange resin. After hydrolysis and partial condensation have been carried out, the catalyst may be removed by washing with water, treating with an ion exchange resin, or a combination thereof as necessary. By removing the catalyst, the storage stability of the photosensitive resin composition can be increased.

The weight average molecular weight (Mw) of the silicone resin (i) is preferably 1,000 to 100,000 and more preferably 1,000 to 50,000. Provided the weight average molecular weight is at least 1,000, the film formability can be improved, and provided the weight average molecular weight is 100,000 or less, the alkali developability is good.

(j) Cyclic Olefin Polymer

In one embodiment, the binder (A) includes a cyclic olefin polymer (j). The cyclic olefin polymer (j) is a homopolymer or copolymer of a cyclic olefin monomer having an alicyclic structure and an ethylenically unsaturated double bond. The cyclic olefin polymer (j) may have a structural unit derived from a monomer other than a cyclic olefin monomer.

Examples of the monomer constituting the cyclic olefin polymer (j) include a cyclic olefin monomer having a polar protic group, a cyclic olefin monomer having a polar aprotic group, a cyclic olefin monomer having no polar group, and a monomer other than cyclic olefins. The monomers other than a cyclic olefin may have a polar protic group or a polar group other than the polar protic group, or may have no polar group.

The cyclic olefin monomer having a polar protic group may be, for example: a carboxyl group-containing cyclic olefin, such as 5-hydroxycarbonylbicyclo[2.2.1]hept-2-ene, 5-methyl-5-hydroxycarbonylbicyclo[2.2.1]hept-2-ene, 5-carboxymethyl-5-hydroxycarbonylbicyclo[2.2.1]hept-2-ene, 5-exo-6-endo-dihydroxycarbonylbicyclo[2.2.1]hept-2-ene, 8-hydroxycarbonyltetracyclo[4.4.0.1$^{2,5}$.1$^{7,10}$]dodec-3-ene, 8-methyl-8-hydroxycarbonyltetracyclo[4.4.0.1$^{2,5}$.1$^{7,10}$] dodec-3-ene, or 8-exo-9-endo-dihydroxycarbonyltetracyclo [4.4.0.1$^{2,5}$.1$^{7,10}$]dodec-3-ene; a hydroxyl group-containing cyclic olefin, such as 5-(4-hydroxyphenyl) bicyclo[2.2.1] hept-2-ene, 5-methyl-5-(4-hydroxyphenyl)bicyclo[2.2.1] hept-2-ene, 8-(4-hydroxyphenyl)tetracyclo[4.4.0.1$^{2,5}$.1$^{7,10}$] dodec-3-ene, or 8-methyl-8-(4-hydroxyphenyl)tetracyclo [4.4.0.1$^{2,5}$.1$^{7,10}$]dodec-3-ene; or a combination of two or more thereof.

The cyclic olefin monomer having a polar aprotic group may be, for example: a cyclic olefin having an ester group, such as 5-acetoxybicyclo[2.2.1]hept-2-ene, 5-methoxycarbonylbicyclo[2.2.1]hept-2-ene, 5-methyl-5-methoxycarbonylbicyclo[2.2.1]hept-2-ene, 8-acetoxytetracyclo[4.4.0.1$^{2,5}$.1$^{7,10}$]dodec-3-ene, 8-methoxycarbonyltetracyclo [4.4.0.1$^{2,5}$.1$^{7,10}$]dodec-3-ene, 8-ethoxycarbonyltetracyclo [4.4.0.1$^{2,5}$.1$^{7,10}$]dodec-3-ene, 8-n-propoxycarbonyltetracyclo[4.4.0.11$^{2,5}$.1$^{7,10}$]dodec-3-ene, 8-isopropoxycarbonyltetracyclo[4.4.0.1$^{2,5}$.1$^{7,10}$]dodec-3-ene, 8-n-butoxycarbonyltetracyclo[4.4.0.1$^{2,5}$.1$^{7,10}$]dodec-3-ene, 8-methyl-8-methoxycarbonyltetracyclo[4.4.0.1$^{2,5}$.1$^{7,10}$]dodec-3-ene, 8-methyl-8-ethoxycarbonyltetracyclo [4.4.0.1$^{2,5}$.1$^{7,10}$]dodec-3-ene, 8-methyl-8-n-propoxycarbonyltetracyclo[4.4.0.1$^{2,5}$.1$^{7,10}$]dodec-3-ene, 8-meth-8-isopropoxycarbonyltetracyclo[4.4.0.1$^{2,5}$.1$^{7,10}$]dodec-3-ene, 8-methyl-8-n-butoxycarbonyltetracyclo[4.4.0.1$^{2,5}$.1$^{7,10}$]dodec-3-ene, 8-(2,2,2-trifluoroethoxycarbonyl)tetracyclo[4.4.0.1$^{2,5}$.1$^{7,10}$]dodec-3-ene, or 8-methyl-8-(2,2,2-trifluoroethoxycarbonyl)tetracyclo[4.4.0.1$^{2,5}$.1$^{7,10}$] dodec-3-ene; a cyclic olefin having an N-substituted imide group, such as N-phenyl-(5-norbornene-2,3-dicarboximide); a cyclic olefin having a cyano group, such as 8-cyanotetracyclo[4.4.0.1$^{2,5}$.1$^{7,10}$]dodec-3-ene, 8-methyl-8-cyanotetracyclo[4.4.0.1$^{2,5}$.1$^{7,10}$]dodec-3-ene, or 5-cyanobicyclo[2.2.1] hept-2-ene; a cyclic olefin having a halogen atom, such as 8-chlorotetracyclo[4.4.0.1$^{2,5}$.1$^{7,10}$]dodec-3-ene, or 8-methyl-8-chlorotetracyclo[4.4.0.1$^{2,5}$.1$^{7,10}$]dodec-3-ene; or a combination of two or more thereof.

The cyclic olefin monomer having no polar group may be, for example, bicyclo[2.2.1]hept-2-ene, 5-ethyl-bicyclo [2.2.1]hept-2-ene, 5-butyl-bicyclo[2.2.1]hept-2-ene, 5-ethylidene-bicyclo[2.2.1]hept-2-ene, 5-methylidene-bicyclo [2.2.1]hept-2-ene, bicyclo[2.2.1]hept-2-ene, tricyclo [4.3.0.1$^{2,5}$]deca-3,7-diene, tetracyclo[8.4.0.1$^{11,14}$.0$^{3,7}$] pentadeca-3,5,7,12,11-pentaene, tetracyclo[4.4.0.1$^{2,5}$.1$^{7,10}$] dec-3-ene, 8-methyl-tetracyclo[4.4.0.1$^{2,5}$.1$^{7,10}$]dodec-3-ene, 8-ethyl-tetracyclo[4.4.0.1$^{2,5}$.1$^{7,10}$]dodec-3-ene, 8-methylidene-tetracyclo[4.4.0.1$^{2,5}$.1$^{7,10}$]dodec-3-ene, 8-ethylidene-tetracyclo[4.4.0.1$^{2,5}$.1$^{7,10}$]dodec-3-ene, 8-vinyl-tetracyclo [4.4.0.1$^{2,5}$.1$^{7,10}$]dodec-3-ene, 8-propenyl-tetracyclo

[4.4.0.1$^{2,5}$.1$^{7,10}$]dodec-3-ene, pentacyclo[6.5.1.1$^{3,6}$.0$^{2,7}$.0$^{9,13}$]pentadeca-3,10-diene, cyclopentene, cyclopentadiene, 1,4-methano-1,4,4a,5,10,10α-hexahydroanthracene, 8-phenyl-tetracyclo[4.4.0.1$^{2,5}$.1$^{7,10}$]dodec-3-ene, tetracyclo[9.2.1.0$^{2,10}$.0$^{3,8}$]tetradeca-3,5,7,12-tetraene, pentacyclo[7.4.0.1$^{3,6}$1$^{10,13}$.0$^{2,7}$]pentadeca-4,11-diene, or pentacyclo[9.2.1.14,7.0$^{2,10}$.0$^{3,8}$]pentadeca-5,12-diene, or a combination of two or more thereof.

Specific examples of a monomer other than the cyclic olefin include: α-olefins with 2 to 20 carbon atoms, such as ethylene, propylene, 1-butene, 1-pentene, 1-hexene, 3-methyl-1-butene, 3-methyl-1-pentene, 3-ethyl-1-pentene, 4-methyl-1-pentene, 4-methyl-1-hexene, 4,4-dimethyl-1-hexene, 4,4-dimethyl-1-pentene, 4-ethyl-1-hexene, 3-ethyl-1-hexene, 1-octene, 1-decene, 1-dodecene, 1-tetradecene, 1-hexadecene, 1-octadecene, and 1-eicosene; linear olefins, such as non-conjugated dienes, such as 1,4-hexadiene, 4-methyl-1,4-hexadiene, 5-methyl-1,4-hexadiene, and 1,7-octadiene; and combinations of two or more thereof.

The cyclic olefin polymer (j) can be synthesized by ring-opening polymerization or addition polymerization of the aforementioned monomers. For the polymerization catalyst, a metal complex of, for example, a molybdenum, ruthenium or osmium complex or a combination of two or more thereof is preferably used. The cyclic olefin polymer (j) may undergo hydrogenation treatment. A catalyst that is generally used for the hydrogenation of olefin compounds may be used as the hydrogenation catalyst. Examples thereof include a Ziegler-type homogeneous catalyst, a precious metal complex catalyst, and a supported precious metal catalyst.

The weight average molecular weight (Mw) of the cyclic olefin polymer (j) is preferably 1,000 to 100,000, and more preferably 1,000 to 50,000. Provided the weight average molecular weight is 1,000 or more, the film formability can be improved, and provided the weight average molecular weight is 100,000 or less, the alkali developability is good.

(k) Cardo Resin

In one embodiment, the binder resin (A) includes a cardo resin (k). The cardo resin (k) has a cardo structure, namely, a skeleton structure in which a quaternary carbon atom constituting a cyclic structure is bonded to two other cyclic structures. The skeleton structure in which a quaternary carbon atom constituting a cyclic structure is bonded to two other cyclic structures may be, for example, a fluorene skeleton, a bisphenol fluorene skeleton, a bisaminophenyl fluorene skeleton, a fluorene skeleton having an epoxy group, or a fluorene skeleton having an acrylic group. The cardo structure may be, for example, a fluorene ring bound to a benzene ring.

The cardo resin (k) can be synthesized by polymerizing a monomer having the cardo structure by reacting functional groups thereof with each other. The method for polymerizing monomers having the cardo structure may be, for example, ring-opening polymerization or addition polymerization. The monomer having the cardo structure may be, for example: a cardo structure-containing bisphenol compound, such as a bis(glycidyloxyphenyl)fluorene epoxy resin, a 9,9-bis(4-hydroxyphenyl)fluorene, or 9,9-bis(4-hydroxy-3-methylphenyl)fluorene; a 9,9-bis(cyanoalkyl)fluorene compound, such as 9,9-bis(cyanomethyl)fluorene; a 9,9-bis(aminoalkyl)fluorene compound, such as 9,9-bis(3-aminopropyl)fluorene; or a combination of two or more thereof. The cardo resin (k) may be a copolymer of a monomer having the cardo structure and an additional monomer that can be copolymerized therewith.

The weight average molecular weight (Mw) of the cardo resin (k) is preferably 1,000 to 100,000 and more preferably 1,000 to 50,000. Provided the weight average molecular weight is at least 1,000, the film formability can be improved, and provided the weight average molecular weight is 100,000 or less, the alkali developability is good.

In one embodiment, the binder resin (A) includes a phenolic resin, such as a phenolic novolak resin, a cresol novolak resin, a triphenylmethane phenolic resin, a phenolic aralkyl resin, a biphenylaralkylphenolic resin, a phenol-dicyclopentadiene copolymer resin, or a derivative thereof. When a phenolic resin is used as the binder (A), a preferable number average molecular weight is generally 100 to 50,000, more preferably 500 to 30,000 and even more preferably 800 to 10,000, although this depends on the resin structure. Provided the number average molecular weight is at least 100, the rate of alkali development is suitable and as the difference in dissolution rate between the light exposed parts and the non-light exposed parts is sufficient, pattern resolution is good, and provided the number average molecular weight is 50,000 or less, the alkali developability is good.

The binder resin (A) may include one type of resin individually or a combination of two or more resins.

The amount of binder resin (A) contained in the photosensitive resin composition with respect to 100 parts by mass of the total of the binder resin (A), the phenolic hydroxyl group-containing compound (B), the radiation sensitive compound (C), and the colorant (D) may be 5 to 60 parts by mass, preferably 10 to 55 parts by mass, more preferably 10 to 50 parts by mass. Provided the amount of the binder resin (A) contained is at least 5 part by mass with respect to 100 parts by mass of the total, the residual film ratio, heat resistance and sensitivity are suitable. Provided the amount of the binder (A) contained is 60 parts by mass or less with respect to 100 parts by mass of the total, the optical density (OD value) of the film after baking may be 0.5 or more per μm of film thickness, and light shielding properties can be retained even after baking.

The binder resin (A) preferably includes at least one selected from the group consisting of resin components (a) to (k), more preferably at least one selected from the group consisting of resin components (a) to (d), and even more preferably at least one selected from the group consisting of resin components (c) and (d). In another preferred embodiment, the binder resin (A) includes at least one selected from the group consisting of (a), (b), and (c).

When a plurality of the resin components (a) to (k) are included, any combination thereof is permitted. Preferably at least two selected from the group consisting of the resin components (a) to (d), more preferably at least two selected from the group consisting of the resin components (a), (c), and (d), and even more preferably the resin components (c) and (d) are included.

The total amount of the at least one resin component selected from the group consisting of (a) to (d) in the binder resin (A) is preferably 0.5% by mass or more, more preferably 50% by mass or more, and even more preferably 88% by mass or more. Provided the total amount of the at least one resin component selected from the group consisting of (a) to (d) in the binder resin (A) is at least 0.5% by mass, the heat resistance of the resin composition is good.

The four types of resin components (a) to (d) may be used in combination. When using the four types in combination, it is preferable that, in the binder resin (A), the proportion of the polyalkenylphenolic resin (a) be 5 to 50% by mass, the proportion of the hydroxypolystyrene resin derivative (b) be 5 to 30% by mass, the proportion of the aqueous alkaline solution-soluble resin having an epoxy group and a phenolic hydroxyl group (c) be 10 to 80% by mass, and the aqueous alkaline solution-soluble copolymer of a polymerizable monomer having an alkali-soluble functional group and an additional polymerizable monomer (d) be 10 to 80% by mass.

[Phenolic Hydroxyl Group-Containing Compound (B)]

The phenolic hydroxyl group-containing compound (B) has a molecular weight of 260 to 5,000 and a phenolic hydroxyl group equivalent of 80 to 155. Herein, when the phenolic hydroxyl group-containing compound is an oligomer or a polymer, the molecular weight thereof refers to a weight average molecular weight which is a standard polystyrene equivalent value measured by gel permeation chromatography (GPC). The phenolic hydroxyl group equivalent is derived by dividing the molecular weight or weight average molecular weight by the number of phenolic hydroxyl groups per molecule (average number in the case of oligomers and polymers). Just one type of phenolic hydroxyl group-containing compound (B) may be used independently or a combination of two or more types may be used.

Although not bound by theory, it is thought that in a coating formed using a photosensitive resin composition, the phenolic hydroxyl group-containing compound (B) is positioned between polymer chains of the binder resin (A) or is entangled with the polymer chains and thereby acts to relieve internal stress of the coating and can thus prevent cracks occurring in the coating. Moreover, the phenolic hydroxyl group-containing compound (B), in the coating formed using the photosensitive resin composition, has alkali solubility at a level that the compound quickly elutes into an alkali developer without the unexposed parts of the coating being excessively dissolved during development. Accordingly, entanglements between polymer chains in the binder resin (A) are released, the surface area in contact with the alkali developer increases, and thus the dissolution of the binder resin (A) in a part that is alkali-soluble during development is promoted. Thereby, the phenolic hydroxyl group-containing compound (B) can impart excellent alkali developability and pattern formability to the photosensitive resin composition even with low energy light exposure.

As the phenolic hydroxyl group-containing compound (B) is an aromatic compound, the compound is not readily modified or decomposed during exposure to light or heat treatment. Accordingly, a high-quality coating can be formed and outgassing resulting from decomposition products of the phenolic hydroxyl group-containing compound (B) can be reduced. The reduction in outgassing also advantageously acts to suppress the occurrence of cracks. There are cases where the phenolic hydroxyl group of the phenolic hydroxyl group-containing compound (B) contributes to the improvement in adhesion of the coating to the substrate.

The molecular weight of the phenolic hydroxyl group-containing compound (B) is 260 to 5,000, preferably 270 to 4,000, more preferably 280 to 3,500, and even more preferably 290 to 3,200. The phenolic hydroxyl group-containing compound (B) having a molecular weight of 260 or more can effectively suppress the occurrence of cracks in the coating. The phenolic hydroxyl group-containing compound (B) having a molecular weight of 5,000 or less can be dissolved or dispersed in the binder resin (A) and other components of the photosensitive resin composition, thereby effectively promoting the dissolution of the binder resin (A) and imparting excellent alkali developability and pattern formability to the photosensitive resin composition even with low energy light exposure.

The phenolic hydroxyl group equivalent of the phenolic hydroxyl group-containing compound (B) is 80 to 155, preferably 85 to 150, more preferably 90 to 148, and even more preferably 94 to 145. The phenolic hydroxyl group-containing compound (B) having a phenolic hydroxyl group equivalent of at least 80 has solubility to the extent that a dissolution suppressing effect brought about by a photoacid generator, such as a diazonaphthoquinone compound, on unexposed parts of the binder resin (A) is not impaired. Even in a positive tone photosensitive resin composition, the film thickness of the unexposed parts of the coating can be maintained at a sufficient level, without excessively dissolving unexposed parts of the coating during development, that excellent pattern formation can be achieved. The phenolic hydroxyl group-containing compound (B) having a phenolic hydroxyl group equivalent of 155 or less can effectively promote the dissolution of the binder resin (A) and can impart excellent alkali developability and pattern formability to the photosensitive resin composition even with low energy light exposure.

In one embodiment, the phenolic hydroxyl group-containing compound (B) does not contain a carboxyl group. The phenolic hydroxyl group-containing compound of this embodiment has low crystallinity due to the lack of hydrogen bonding resulting from a highly polar carboxyl group and has excellent compatibility with the binder resin (A). As solubility in the developer is not excessively high, the reduction in film thickness of the cured coating after development can be limited to a practical range.

The phenolic hydroxyl group-containing compound (B) may be, for example: a non-polymeric compound, such as tris(4-hydroxyphenyl)methane (molecular weight 292.33, phenolic hydroxyl group equivalent 97), 1,1,1-tris(4-hydroxyphenyl)ethane (molecular weight 306.36, phenolic hydroxyl group equivalent 102), α,α,α'-tris(4-hydroxyphenyl)-1-ethyl-4-isopropylbenzene (molecular weight 424.54, phenolic hydroxyl group equivalent 142); or an oligomeric or polymeric compound, such as a phenol novolak resin, a cresol novolak resin, a naphthalenediol phenolic resin, a salicylaldehyde phenolic resin, a triphenylmethane phenolic resin, or a biphenylaralkyl phenolic resin. "Non-polymeric compound" as used herein refers to a compound that does not have a repeating unit structure formed by the polymerization of two or more monomers.

In one embodiment, the phenolic hydroxyl group-containing compound (B) is a non-polymeric compound. The non-polymeric compound has particularly excellent alkali developability and pattern formability under low energy light exposure. The molecular weight of the non-polymeric compound is preferably 260 to 800, more preferably 270 to 600, and even more preferably 280 to 500.

In another embodiment, the phenolic hydroxyl group-containing compound (B) is an oligomeric or polymeric compound. Oligomeric and polymeric compounds are particularly effective at suppressing the occurrence of cracks in the coating. The oligomeric or polymeric compound has a molecular weight (weight average molecular weight) of preferably 500 to 5,000, more preferably, 600 to 4,000, and even more preferably 700 to 3,200.

The phenolic hydroxyl group-containing compound (B), from the standpoint of molecular weight and phenolic hydroxyl group equivalent, is preferably tris(4-hydroxyphenyl)methane, 1,1,1-tris(4-hydroxyphenyl)ethane, α,α,α'-tris(4-hydroxyphenyl)-1-ethyl-4-isopropylbenzene, or a phenol novolak resin, a cresol novolak resin, a naphthalenediol phenolic resin, a salicylaldehyde phenolic resin, a triphenylmethane phenolic resin, or a biphenylaralkyl phenolic resin, these resins having a molecular weight and a phenolic hydroxyl equivalent within the preferable ranges; more preferably tris(4-hydroxyphenyl)methane, 1,1,1-tris(4-hydroxyphenyl)ethane, α,α,α'-tris(4-hydroxyphenyl)-1-ethyl-4-isopropylbenzene, or a phenol novolak resin, a triphenylmethane phenolic resin, or a biphenylaralkyl phenolic resin, these resins having a molecular weight and a phenolic hydroxyl equivalent within the preferable ranges; even more preferably, tris(4-hydroxyphenyl)methane, 1,1,1-tris(4-hydroxyphenyl)ethane, or a phenol novolak resin having a molecular weight and a phenolic hydroxyl equivalent within the preferable ranges.

The amount of the phenolic hydroxyl group-containing compound (B) contained in the photosensitive resin composition with respect to 100 parts by mass of the total of the binder resin (A), the phenolic hydroxyl group-containing compound (B), the radiation sensitive compound (C), and the colorant (D) can be 0.1 to 20 parts by mass, preferably 1 to 15 parts by mass, and more preferably 3 to 12 parts by mass. Provided the content of the phenolic hydroxyl group-containing compound (B) is 0.1 parts by mass or more with respect to 100 parts by mass of the total, the dissolution of the binder resin (A) can be effectively promoted and the occurrence of cracks in the coating can be effectively suppressed, and provided the content is 20 parts by mass or less, excessive dissolution of the binder resin (A) can be suppressed and formability of the coating pattern, surface quality, etc., can be improved.

[(C) Radiation Sensitive Compound]

For the radiation sensitive compound, a photoacid generator, a photobase generator or a photopolymerization initiator may be used. The photoacid generator is a compound that generates acid when exposed to radiation, such as visible light, ultraviolet light, γ rays, and electron beams. Since the photoacid generator increases the solubility in an aqueous alkaline solution of parts exposed to radiation, the photoacid generator can be used in positive tone photosensitive resin compositions in which the parts are made to be dissolved. The photobase generator is a compound that generates a base when exposed to radiation. Since the photobase generator decreases the solubility in an aqueous alkaline solution of parts exposed to radiation, the photobase generator can be used in negative tone photosensitive resin compositions in which the parts are made to be non-soluble. The photopolymerization initiator is a compound that generates radicals when exposed to radiation. When the photosensitive resin composition comprises a radical polymerizable functional group-containing binder or a radical polymerizable compound, radical polymerization of irradiated parts of the radical polymerizable functional groups of the binder resin or the radical polymerizable compound proceeds, and a polymerized product which is insoluble in an aqueous alkaline solution is formed in the parts. Thus, the photopolymerization initiator can be used in negative tone photosensitive resin compositions.

It is preferable from the standpoint of achieving high sensitivity and high pattern resolution that the radiation sensitive compound (C) be a photoacid generator. For the photoacid generator, at least one selected from the group consisting of quinone diazide compounds, sulfonium salts, phosphonium salts, diazonium salts, and iodonium salts may be used. In one embodiment, the photoacid generator is a compound or salt with high sensitivity to i-rays (365 nm).

It is preferable that for the photoacid generator, a quinone diazide compound be used. The quinone diazide compound may be a polyhydroxy compound to which the sulfonic acid of the quinone diazide is bonded through an ester, a polyamino compound to which the sulfonic acid of the quinone diazide is bonded through a sulfonamide bond, or a polyhydroxy polyamino compound to which the sulfonic acid of the quinone diazide is bonded through an ester or sulfonamide bond. From the standpoint of contrast between exposed and unexposed parts, it is preferable that at least 20 mol % of the total of the functional groups of the polyhydroxy compound or polyamino compound be substituted with quinone diazide.

The polyhydroxy compound may be Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, Methylenetris-FR—CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, or HML-TPHAP (trade names, Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, or TM-BIP-A (trade names, Asahi Yukizai Corporation), 2,6-dimethoxymethyl-4-tert-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylene bisphenol, or BisP-AP (trade name, Honshu Chemical Industry Co., Ltd.), but is not limited thereto.

The polyamino compound may be 1,4-phenylenediamine, 1,3-phenylenediamine, 4,4'-diaminodiphenyl ether, 4,4'-diaminodiphenylmethane, 4,4'-diaminodiphenyl sulfone, or 4,4'-diaminodiphenyl sulfide, but is not limited thereto.

The polyhydroxypolyamino compound may be 2,2-bis(3-amino-4-hydroxyphenyl)hexafluoropropane, or 3,3'-dihydroxybenzidine, but is not limited thereto.

Specific examples of the quinone diazide compound include 1,2-naphthoquinonediazide-4-sulfonic acid esters and 1,2-naphthoquinonediazide-5-sulfonic acid esters of a polyhydroxy compound.

The quinone diazide compound forms a carboxyl group when exposed to UV light, etc., through the reaction illustrated in reaction formula 2 below. The formation of the carboxyl group makes a light-exposed part (coating) soluble in an aqueous alkaline solution and generates alkali developability in the part.

Reaction formula 2

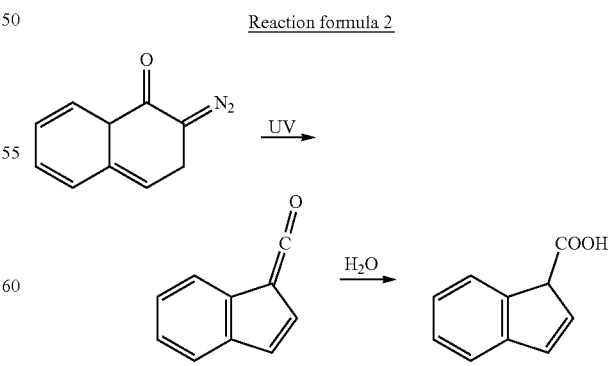

When the radiation sensitive compound (C) is a photoacid generator, the amount of the photoacid generator contained in the photosensitive resin composition may be, with respect to 100 parts by mass of the total of the binder resin (A), the phenolic hydroxyl group-containing compound (B), the radiation sensitive compound (C) and the colorant (D), 5 to 50 parts by mass, preferably 10 to 45 parts by mass, and more preferably 15 to 40 parts by mass. Provided the content of the photoacid generator with respect to 100 parts by mass of the total is at least 5 parts by mass, the alkali developability is good, and provided the content is 50 parts by mass or less, the reduction of coating due to heat treatment at 300° C. or more can be suppressed.

For the radiation sensitive compound (C), a photobase generator may be used. For the photobase generator, at least one selected from the group consisting of amide compounds and ammonium salts may be used. In one embodiment, the photobase generator is a compound or salt with high sensitivity to i-rays (365 nm).

The amide compound may be, for example, 2-nitrophenylmethyl-4-methacryloyloxypiperidine-1-carboxylate, 9-anthrylmethyl-N,N-dimethyl carbamate, 1-(anthraquinone-2-yl)ethylimidazole carboxylate, or (E)-1-[3-(2-hydroxyphenyl)-2-propenoyl]piperidine. The ammonium salt may be, for example, 1,2-diisopropyl-3-[bis(dimethylamino)methylene]guanidinium 2-(3-benzoylphenyl)propionate, (Z)-{[bis(dimethylamino)methylidene]amino}-N-cyclohexylamino)methanaminium tetrakis(3-fluorophenyl)borate, or 1,2-dicyclohexyl-4,4,5,5-tetramethylbiguanidinium n-butyltriphenylborate.

When the radiation sensitive compound (C) is a photobase generator, the amount of the photobase generator contained in the photosensitive resin composition may be, with respect to 100 parts by mass of the total of the binder resin (A), the phenolic hydroxyl group-containing compound (B), the radiation sensitive compound (C) and the colorant (D), 0.1 to 25 parts by mass, preferably 0.5 to 20 parts by mass, and more preferably 1 to 15 parts by mass. Provided the content of the photobase generator with respect to 100 parts by mass of the total is at least 0.1 parts by mass, the alkali developability is good, and provided the content is 20 parts by mass or less, the reduction of coating due to heat treatment at 300° C. or more can be suppressed.

For the radiation sensitive compound (C), a photopolymerization initiator may be used. For the photopolymerization initiator, at least one selected from the group consisting of benzyl ketal compounds, α-hydroxy ketone compounds, α-amino ketone compounds, acyl phosphine oxide compounds, oxime ester compounds, acridine compounds, benzophenone compounds, acetophenone compounds, aromatic keto ester compounds and benzoic acid esters compounds can be used. In one embodiment, the photopolymerization initiator is a compound with high sensitivity to i-rays (365 nm). As the sensitivity is high during light exposure, the photopolymerization initiator is preferably an α-hydroxy ketone compound, an α-amino ketone compound, an acyl phosphine oxide compound, an oxime ester compound, an acridine compound or a benzophenone compound, and more preferably an α-amino ketone compound, an acyl phosphine oxide compound, or an oxime ester compound.

The benzyl ketal compound may be, for example, 2,2-dimethoxy-1,2-diphenylethane-1-one. The α-hydroxy ketone compound may be, for example, 1-(4-isopropylphenyl)-2-hydroxy-2-methylpropan-1-one, 2-hydroxy-2-methyl-1-phenylpropan-1-one, 1-hydroxycyclohexyl phenyl ketone, 1-[4-(2-hydroxyethoxy)phenyl]-2-hydroxy-2-methylpropan-1-one, or 2-hydroxy-1-[4-[4-(2-hydroxy-2-methylpropionyl)benzyl]phenyl]-2-methylpropan-1-one. The α-aminoketone compound may be, for example, 2-dimethylamino-2-methyl-1-phenylpropan-1-one, 2-diethylamino-2-methyl-1-phenylpropan-1-one, 2-methyl-2-morpholino-1-phenylpropane-1-one, 2-dimethylamino-2-methyl-1-(4-methylphenyl)propan-1-one, 2-dimethylamino-1-(4-ethylphenyl)-2-methylpropan-1-one, 2-dimethylamino-1-(4-isopropylphenyl)-2-methylpropan-1-one, 1-(4-butylphenyl)-2-dimethylamino-2-methylpropan-1-one, 2-dimethylamino-1-(4-methoxyphenyl)-2-methylpropan-1-one, 2-dimethylamino-2-methyl-1-(4-methylthiophenyl)propan-1-one, 2-methyl-1-(4-methylthiophenyl)-2-morpholinopropan-1-one, 2-benzyl-2-dimethylamino-1-(4-morpholinophenyl)-butan-1-one, 2-benzyl-2-dimethylamino-1-(4-dimethylaminophenyl)-butan-1-one, or 2-dimethylamino-2-[(4-methylphenyl)methyl]-1-[4-(4-morpholinyl))phenyl]-1-butanone. The acyl phosphine oxide compound may be, for example, 2,4,6-trimethylbenzoyl-diphenylphosphine oxide, bis(2,4,6-trimethylbenzoyl)-phenylphosphine oxide or bis(2,6-dimethoxybenzoyl)-(2,4,4-trimethylpentyl)phosphine oxide. The oxime ester compound may be, for example, 1-phenylpropane-1,2-dione-2-(O-ethoxycarbonyl)oxime, 1-phenylbutane-1,2-dione-2-(O-methoxycarbonyl)oxime, 1,3-diphenylpropane-1,2,3-trione-2-(O-ethoxycarbonyl)oxime, 1-[4-(phenylthio)phenyl]octane-1,2-dione-2-(O-benzoyl)oxime, 1-[4-[4-(carboxyphenyl)thio]phenyl]propane-1,2-dione-2-(O-acetyl)oxime, 1-[9-ethyl-6-(2-methylbenzoyl)-9H-carbazol-3-yl]ethanone-1-(O-acetyl)oxime, or 1-[9-ethyl-6-[2-methyl-4-[1-(2,2-dimethyl-1,3-dioxolan-4-yl)methyloxy]benzoyl]-9H-carbazol-3-yl]ethanone-1-(O-acetyl) oxime. The acridine compound may be, for example, 1,7-bis(acridin-9-yl)-n-heptane. The benzophenone compound may be, for example, benzophenone, 4,4'-bis(dimethylamino)benzophenone, 4,4'-bis(diethylamino)benzophenone, 4-phenylbenzophenone, 4,4-dichlorobenzophenone, 4-hydroxybenzophenone, alkylated benzophenones, 3,3',4,4'-tetrakis(tert-butylperoxycarbonyl)benzophenone, 4-methylbenzophenone, dibenzyl ketone or fluorenone. The acetophenone compound may be, for example, 2,2-diethoxyacetophenone, 2,3-diethoxyacetophenone, 4-tert-butyldichloroacetophenone, benzalacetophenone or 4-azidobenzalacetophenone. The aromatic keto ester compound may be, for example, methyl 2-phenyl-2-oxyacetate. The benzoic acid ester compound may be, for example, ethyl 4-dimethylaminobenzoate, (2-ethyl)hexyl 4-dimethylaminobenzoate, ethyl 4-diethylaminobenzoate or methyl 2-benzoylbenzoate.

When the binder resin (A) has a cationic polymerizable group, such as an epoxy group, it is possible to use a photo-cationic polymerization initiator that generates a cation species or Lewis acid on exposure to light. The photo-cationic polymerization initiator may be, for example, an onium salt composed of a cationic part and an anionic part, wherein the cationic part is a sulfonium, such as triphenylsulfonium or diphenyl-4-(phenylthio)phenylsulfonium; an iodonium, such as diphenyliodonium or bis(dodecylphenyl)iodonium; a diazonium, such as phenyldiazonium; a pyridinium, such as 1-benzyl-2-cyanopyridinium or 1-(naphthylmethyl)-2-cyanopyridinium; or an Fe cation, such as (2,4-cyclopentadien-1-yl)[(1-methylethyl)benzene]-Fe, and wherein the anionic part is $BF_4^-$, $PF_6^- SbF_6^-$, or $[BX_4]^-$ (where X is a phenyl group substituted with at least 2 fluorine atoms or a trifluoromethyl group).

When the radiation sensitive compound (C) is a photopolymerization initiator, the amount of the photopolymerization initiator contained in the photosensitive resin composition with respect to 100 parts by mass of the total of the binder resin (A), the phenolic hydroxyl group-containing compound (B), the radiation sensitive compound (C), and the colorant (D) can be 0.1 to 25 parts by mass, preferably 0.5 to 20 parts by mass, more preferably 1 to 15 parts by mass. Provided the content of the radiation sensitive compound (C) is at least 0.1 parts by mass with respect to 100 parts by mass of the total, the alkali developability is good, and provided the content is 20 parts by mass or less, the reduction of coating due to heating at 300° C. or more can be suppressed.

When the radiation sensitive compound (C) is a photopolymerization initiator, the photosensitive resin composition can further contain a radical polymerizable compound. As the radical polymerizable compound, a resin or compound having a plurality of ethylenically unsaturated groups can form crosslinking of a coating to increase the hardness thereof.

From the standpoint of reactivity during light exposure, and hardness, heat resistivity, etc., of the coating, the radical polymerizable compound is preferably a compound having a plurality of (meth)acrylic groups. Such a compound may be diethylene glycol di(meth)acrylate, triethylene glycol di(meth)acrylate, tetraethylene glycol di(meth)acrylate, propylene glycol di(meth)acrylate, trimethylolpropane di(meth)acrylate, trimethylolpropane tri(meth)acrylate, ethoxylated trimethylolpropane di(meth)acrylate, ethoxylated trimethylolpropane tri(meth)acrylate, ditrimethylolpropane tri(meth)acrylate, ditrimethyloipropane tetra(meth)acrylate, 1,3-butanediol di(meth)acrylate, neopentyl glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, dimethylol-tricyclodecane di(meth)acrylate, ethoxylated glycerin tri(meth)acrylate, pentaerythritol tri(meth)acrylate, pentaerythritol tetra(meth)acrylate, ethoxylated pentaerythritol tri(meth)acrylate, ethoxylated pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, tetrapentaerythritol nona(meth)acrylate, tetrapentaerythritol deca(meth)acrylate, pentapentaerythritol undeca(meth)acrylate, pentapentaerythritol dodeca(meth)acrylate, ethoxylated bisphenol A di(meth)acrylate, 2,2-bis[4-(3-(meth)acryloxy-2-hydroxypropoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene or 9,9-bis(4-(meth)acryloxyphenyl)fluorene, or an acid modified product, an ethylene oxide modified product or a propylene oxide modified product thereof.

The amount of the radical polymerizable compound contained in the photosensitive resin composition with respect to 100 parts by mass of the binder resin (A) may be 15 to 65 parts by mass, and is preferably 20 to 60 parts by mass, and more preferably 25 to 50 parts by mass. Provided the content of the radical polymerizable compound is within the aforementioned ranges, the alkali developability is good and the heat resistivity of the cured coating can be improved.

(D) Colorant

The colorant (D) is selected from the group consisting of black dyes and black pigments. A black dye and a black pigment can also be used in combination. By forming black barrier ribs in organic EL elements using a photosensitive resin composition containing the colorant (D), the visibility of a display device, such as an organic EL display, etc., can be improved.

In one embodiment, the colorant (D) contains a black dye. For the black dye, a dye defined by the color index (C.I.) as solvent black 27 to 47 may be used. The black dye is preferably one defined by the C.I. as solvent black 27, 29 or 34. When at least one black dye of the dyes defined by the C.I. as solvent black 27 to 47 is used, the light shielding properties of the coating of the photosensitive resin composition after baking can be maintained. The black dye-containing photosensitive resin composition, compared to a black pigment-containing photosensitive resin composition, leaves less colorant residue during development and can form high definition patterns in the coating.

When the colorant (D) is a black dye, the amount of the black dye contained in the photosensitive resin composition with respect to 100 parts by mass of the total of the binder resin (A), the phenolic hydroxyl group-containing compound (B), the radiation sensitive compound (C), and the colorant (D) is preferably 1 to 70 parts by mass, more preferably 5 to 60 parts by mass, and even more preferably 10 to 50 parts by mass. Provided the content of the black dye is at least 1 part by mass with respect to 100 parts by mass of the total, the light shielding properties of the coating after baking can be maintained, and provided the content of the black dye is 70 parts by mass or less with respect to 100 parts by mass of the total, the residual film ratio, heat resistance, sensitivity, etc., are suitable.

A black pigment may be used for the colorant (D). The black pigment may be carbon black, carbon nanotubes, acetylene black, graphite, iron black, aniline black, titanium black, a perylene pigment, a lactam pigment, etc. These black pigments may be used after surface treatment has been carried out thereon. Examples of commercially available perylene pigments include K0084, K0086, and pigment black 21, 30, 31, 32, 33 and 34 manufactured by BASF. An example of a commercially available lactam pigment is Irgaphor® Black S 0100 CF manufactured by BASF. The black pigment is preferably at least one selected from the group consisting of carbon black, titanium black, a perylene pigment, and a lactam pigment due to high light shielding properties. For a negative tone photosensitive resin composition in which the radiation sensitive compound (C) is a photopolymerization initiator, it is advantageous for the colorant (D) to be a black pigment that is less likely to inhibit polymerization.

When the colorant (D) is a black pigment, the amount of the black pigment contained in the photosensitive resin composition with respect to 100 parts by mass of the total of the binder resin (A), the phenolic hydroxyl group-containing compound (B), the radiation sensitive compound (C), and the colorant (D) is preferably 1 to 70 parts by mass, more preferably 5 to 60 parts by mass, and even more preferably 10 to 50 parts by mass. Provided the content of the black pigment is at least 1 part by mass with respect to 100 parts by mass of the total, sufficient light shielding properties can be achieved, and provided the content of the black pigment is 70 parts by mass or less with respect to 100 parts by mass of the total, the residual film ratio, sensitivity, etc., are suitable.

When the colorant (D) includes both a black dye and a black pigment, the total amount of the black dye and the black pigment contained in the photosensitive resin composition with respect to 100 parts by mass of the total of the binder resin (A), the phenolic hydroxyl group-containing compound (B), the radiation sensitive compound (C), and the colorant (D) is preferably 1 to 70 parts by mass, more preferably 5 to 60 parts by mass, and even more preferably 10 to 50 parts by mass. Provided the total amount of the black dye and the black pigment is at least 1 part by mass with respect to 100 parts by mass of the total, sufficient light shielding properties can be achieved, and provided the content of the black pigment is 70 parts by mass or less with respect to 100 parts by mass of the total, the residual film ratio, sensitivity, etc., are suitable.

(E) Optional Component

The photosensitive resin composition may include, as an optional component, a thermosetting agent, a surfactant, a colorant other than (D), etc. The optional component (E) is defined as any component that does not correspond to any of (A) to (D).

A thermal radical generator may be used for the thermosetting agent. The thermal radical generator is preferably an organic peroxide. Specific examples thereof include organic peroxides with a 10 hour half-life temperature of 100 to 170° C., such as dicumyl peroxide, 2,5-dimethyl-2,5-di(tert-butylperoxy)hexane, tert-butylcumyl peroxide, di-tert-butyl peroxide, 1,1,3,3-tetramethylbutyl hydroperoxide, and cumene hydroperoxide.

The amount of the thermosetting agent contained with respect to 100 parts by mass of the total of the binder resin (A), the phenolic hydroxyl group-containing compound (B), the radiation sensitive compound (C), the colorant (D), and other solid content (excluding the thermosetting agent) is preferably 5 parts by mass or less, more preferably 4 parts by mass or less, and even more preferably 3 parts by mass or less.

The photosensitive resin composition may include a surfactant in order to, for example, improve coatability, smoothness of the coating, or developability of the coating. The surfactant may be, for example, a polyoxyethylene alkyl ether, such as polyoxyethylene lauryl ether, polyoxyethylene stearyl ether, or polyoxyethylene oleyl ether; a polyoxyethylene aryl ether, such as polyoxyethylene octyl phenyl ether, or polyoxyethylene nonyl phenyl ether; a nonionic surfactant, such as a polyoxyethylene dialkyl ester (e.g., polyoxyethylene dilaurate or polyoxyethylene distearate); a fluorosurfactant, such as Megaface® F-251, Megaface F-281, Megaface F-430, Megaface F-444, Megaface R-40, Megaface F-553, Megaface F-554, Megaface F-555, Megaface F-556, Megaface F-557, Megaface F-558, Megaface F-559 (trade names, DIC Corporation), Surflon® S-242, Surflon S-243, Surflon S-386, Surflon S-420, or Surflon S-611 (trade names, ACG Seimi Chemical Co., Ltd.); or an organosiloxane polymer KP 323, KP 326, or KP 341 (trade names, Shin-Etsu Chemical Co., Ltd.). These may be used individually or in a combination of two or more.

The content of the surfactant with respect to 100 parts by mass of the total of the binder resin (A), the phenolic hydroxyl group-containing compound (B), the radiation sensitive compound (C), and the colorant (D) and the other solid content (excluding the surfactant) is preferably 2 parts by mass or less, more preferably 1 part by mass or less, and even more preferably 0.5 parts by mass or less.

The photosensitive resin composition may include a second colorant other than the black dye and black pigment. The second colorant may be a dye, an organic pigment, an inorganic pigment, etc., and may be used according to the purpose thereof. The second colorant may be used in such an amount that the effect of the invention is not impaired.

The dye may be, for example, an azo dye, a benzoquinone dye, a naphthoquinone dye, an anthraquinone dye, a cyanine dye, a squarylium dye, a croconium dye, a merocyanine dye, a stilbene dye, a diphenylmethane dye, a triphenylmethane dye, a fluoran dye, a spiropyran dye, a phthalocyanine dye, an indigo dye, a fulgide dye, a nickel complex dye, or an azulene dye.

The pigment may be, for example, C.I. pigment yellow 20, 24, 86, 93, 109, 110, 117, 125, 137, 138, 147, 148, 153, 154, or 166, C.I. pigment orange 36, 43, 51, 55, 59, or 61, C.I. pigment red 9, 97, 122, 123, 149, 168, 177, 180, 192, 215, 216, 217, 220, 223, 224, 226, 227, 228, or 240, C.I. pigment violet 19, 23, 29, 30, 37, 40, or 50, C.I. pigment blue 15, 15:1, 15:4, 22, 60, or 64, C.I. pigment green 7, or C.I. pigment brown 23, 25, or 26.

(F) Solvent

The photosensitive resin composition may be dissolved in a solvent and used as a solution (note that when a black pigment is included, the pigment is in suspension). For example, the photosensitive resin composition in solution may be prepared by mixing specific amounts of the phenolic hydroxyl group-containing compound (B), the radiation sensitive compound (C), the colorant (D), and an optional component (E), such as a thermosetting agent or a surfactant, as needed, with a solution obtained by dissolving the binder (A) in the solvent (F). The photosensitive resin composition may be adjusted to have a viscosity suitable for the coating method by changing the amount of the solvent.

The solvent may be, for example, a glycol ether, such as ethylene glycol monomethyl ether, ethylene glycol dimethyl ether, ethylene glycol methyl ethyl ether, or ethylene glycol monoethyl ether; an ethylene glycol alkyl ether acetate, such as methyl cellosolve acetate or ethyl cellosolve acetate; a diethylene glycol compound, such as diethylene glycol monomethyl ether, diethylene glycol diethyl ether, diethylene glycol dimethyl ether, diethylene glycol ethyl methyl ether, diethylene glycol monoethyl ether, or diethylene glycol monobutyl ether; a propylene glycol alkyl ether acetate compound, such as propylene glycol methyl ether acetate or propylene glycol ethyl ether acetate; an aromatic hydrocarbon, such as toluene or xylene; a ketone, such as methyl ethyl ketone, methyl amyl ketone, cyclohexanone, 4-hydroxy-4-methyl-2-pentanone, or cyclohexanone; an ester, such as ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanoate, methyl 3-methoxypropionate, ethyl 3-methoxypropionate, methyl 3-ethoxypropionate, ethyl 3-ethoxypropionate, ethyl acetate, butyl acetate, methyl lactate, ethyl lactate, or γ-butyrolactone; or an amide compound, such as N-methyl-2-pyrrolidone, N,N-dimethylformamide, or N,N-dimethylacetamide. These solvents may be used individually or in a combination of two or more thereof.

The photosensitive resin composition may be prepared by dissolving or dispersing the binder resin (A), the phenolic hydroxyl group-containing compound (B), the radiation sensitive compound (C), the colorant (D), and the optional component (E) as necessary in the solvent (F) and mixing the same. The concentration of the solid content in the photosensitive resin composition may be determined as appropriate according to the intended use therefor. For example, the concentration of the solid content in the photosensitive resin composition may be 1 to 60% by mass, 3 to 50% by mass, or 5 to 40% by mass.

A publicly known method may be used for the dispersion mixing method when using a pigment. For example, a ball mill, a sand mill, a bead mill, a paint shaker, a ball type mill, such as a rocking mill, a kneader, a paddle mixer, a planetary mixer, a bladed type, such as a Henschel mixer, and a roll type mill, such as 3-roll mixer, may be used as well as a mortar machine, colloid mill, ultrasonic waves, a homogenizer, rotation and revolution mixer, etc. From the standpoint of dispersion efficiency and a fine dispersion, a bead mill is preferably used.

The prepared photosensitive resin composition is usually filtered before use. The filtering means may be, for example, a millipore filter with a pore size of 0.05 to 1.0 µm.

The photosensitive resin composition prepared in such a way has excellent long-term storage stability.

When the photosensitive resin composition is used in radiation lithography, the photosensitive resin composition is first dissolved or dispersed in a solvent to prepare the coating composition. Next, the coating composition is applied on a substrate surface, the solvent is removed by heating, etc., and a coating can be formed. There are no particular restrictions on the method of applying the coating composition on the substrate surface and, for example, a spray method, a roll coating method, a slit method, or a spin coating method may be used.

After applying the coating composition onto the substrate surface, the solvent is typically removed by heating to form a coating (prebaking). Although the heating conditions will differ according to the types of components, the blending ratios thereof, etc., usually the coating can be obtained by heat treatment at 70 to 130° C., for example, for 1 to 20 minutes on a hot plate or for 3 to 60 minutes in an oven.

Next, the prebaked coating is exposed to radiation (e.g., visible light, ultraviolet, far-ultraviolet, X-rays, microwaves, gamma ray, or synchrotron radiation) through a photomask having a predetermined pattern (light exposure step). When a quinone diazide compound is used as the radiation sensitive compound, the radiation used is preferably ultraviolet to visible light having a wavelength of 250 to 450 nm. In one embodiment, the radiation is i-rays. In another embodiment, the radiation includes g-, h-, and i-rays.

After the light exposure step, the coating is brought into contact with a developer and developed, unnecessary parts are removed and a pattern is formed on the coating (developing step). The developer may be an aqueous solution of an alkali compound, for example: an inorganic alkali, such as sodium hydroxide, potassium hydroxide, sodium carbonate, sodium silicate, sodium metasilicate, or ammonia water; a primary amine, such as ethylamine and n-propylamine; a secondary amine, such as diethylamine and di-n-propylamine; a tertiary amine, such as triethylamine and methyl diethylamine; an alcohol amine, such as dimethylethanolamine and triethanolamine; a quaternary ammonium salt, such as tetramethylammonium hydroxide, tetraethyl ammonium hydroxide, or choline; or a cyclic amine, such as pyrrole, piperidine, 1,8-diazabicyclo[5.4.0]-7-undecene, or 1,5-diazabicyclo[4.3.0]-5-nonane. An aqueous solution having added thereto, for example, a water-soluble organic solvent, such as methanol or ethanol, or a surfactant in an appropriate amount may be used as the developer. The developing time is usually 30 to 180 seconds. The developing method may be any one of a puddle method, a shower method, or a dipping method. After development, a pattern can be formed on the coating by cleaning with running water for 30 to 90 seconds, removal of unnecessary parts, and air drying with compressed air or compressed nitrogen.

Thereafter, the coating with the pattern formed thereon is heat treated with a heating device, such as a hot plate or an oven at, for example, 100 to 350° C. for 20 to 200 minutes to thereby obtain a cured coating (post-baking, heat treating step). During the heat treatment, the temperature may be maintained at a fixed temperature, continuously increased, or increased in a stepwise manner.

The optical density (OD value) of the cured coating of the photosensitive resin composition is preferably 0.5 or more per µm thickness of film, more preferably 0.7 or more, and even more preferably 1.0 or more. Provided the OD value of the cured coating is at least 0.5 per µm thickness of film, sufficient light shielding properties can be obtained.

One embodiment is a method of producing an organic EL element barrier rib comprising: preparing a coating composition by dissolving or dispersing a photosensitive resin composition in a solvent; forming a coating by applying the coating composition on a substrate; drying the coating by removing the solvent contained in the coating; irradiating the dried coating with radiation through a photomask thereby exposing the coating; forming a pattern on the coating by developing the exposed coating by bringing the coating into contact with a developer; and forming the organic EL element barrier rib by heat treating the coating on which the pattern is formed at a temperature of 100 to 350° C.

One embodiment is an organic EL element barrier rib comprising a cured photosensitive resin composition.

One embodiment is an organic EL element comprising a cured photosensitive resin composition.

EXAMPLES

The invention will be specifically explained based on the following examples and comparative examples but is not limited thereby.

The weight average molecular weight and the number average molecular weight of the binder resin (A) were calculated using a calibration curve created using a standard polystyrene under the following measurement conditions.
Name of equipment: Shodex® GPC-101
Column: Shodex® LF-804
Mobile phase: tetrahydrofuran
Flow rate: 1.0 mL/min
Detector: Shodex® RI-71
Temperature: 40° C.

(1) Synthesis of Binder Resin (A)

[Production Example 1] Production of Aqueous Alkaline Solution-Soluble Resin Having an Epoxy Group and a Phenolic Hydroxyl Group (c)

37.6 g of EPICLON® N-770 (phenol novolak epoxy resin, epoxy equivalent 188, manufactured by DIC Corporation) as a compound having at least two epoxy groups per molecule was charged with 75.2 g of γ-butyrolactone (Mitsubishi Chemical Corporation) as a solvent into a 300 mL 3-neck flask and dissolved under a nitrogen gas atmosphere at 60° C. 20.1 g (0.65 equivalents to 1 equivalent of epoxy) of 3,5-dihydroxybenzoic acid (Fujifilm Wako Pure Chemical Corporation) as the hydroxybenzoic acid compound and 0.173 g (0.660 mmol) of triphenylphosphine (Tokyo Chemical Industry Co., Ltd.) as a reaction catalyst were added thereto and reacted for 21 hours at 110° C. The reaction solution was returned to room temperature and diluted to 20% by mass of solid components with γ-butyrolactone, the solution was filtered and 197.7 g of resin solution c was obtained. The obtained reaction product had a number average molecular weight of 2,400 and a weight average molecular weight of 8,300.

[Production Example 2] Production of Aqueous Alkaline Solution-Soluble Copolymer of a Polymerizable Monomer Having an Alkali-Soluble Functional Group and an Additional Polymerizable Monomer (d)

28.0 g of 4-hydroxyphenyl methacrylate ("PQMA" manufactured by Showa Denko K.K.) and 7.89 g of N-cyclohexyl maleimide (Nippon Shokubai Co., Ltd.) were completely dissolved in 77.1 g of 1-methoxy-2-propyl acetate (Daicel Corporation), and 3.66 g of V-601 (Fujifilm Wako Pure Chemical Corporation) used as a polymerization initiator was completely dissolved in 14.6 g of 1-methoxy-2-propyl acetate (Daicel Corporation). The resulting two solutions were both simultaneously dripped for two hours into 61.2 g of 1-methoxy-2-propyl acetate (Daicel Corporation) heated to 85° C. under a nitrogen atmosphere in a 300 mL 3-neck flask, and then reacted for three hours at 85° C. The reaction solution that had cooled to room temperature was dripped into 815 g of toluene and a copolymer was precipitated. The precipitated copolymer was recovered by filtration, and vacuum dried for 4 hours at 90° C. 32.4 g of white powder was collected. This was dissolved in γ-butyrolactone and a resin solution d having a solid concentration of 20% by mass was obtained. The obtained reaction product had a number average molecular weight of 6,100 and a weight average molecular weight of 11,800.

(2) Raw Material (A) Binder Resin

The resins indicated in Table 1 were used as the binder resin (A).

TABLE 1

| Resin Component | Name or abbreviation | Explanation | Source |
|---|---|---|---|
| Polyalkenylphenolic resin (a) | PR-56-2 | m/p-cresol novolak resin, 40% by mass solid content, weight average molecular weight 15,000 | DIC Corporation |
| Hydroxypolystyrene resin derivative (b) | HMPMPS | 4-(hydroxymethyl)phenoxymethyl polystyrene resin, 1% divinylbenzene crosslinking, 100% by mass solid content, weight average molecular weight 36,000 | Tokyo Chemical Industry Co., Ltd. |
| Aqueous alkaline solution-soluble resin having an epoxy group and a phenolic hydroxyl group (c) | Resin solution c | Synthesized in production example 1, 20% by mass solid content, weight average molecular weight 8,300 | — |
| Aqueous alkaline solution-soluble copolymer of a polymerizable monomer having an alkali-soluble functional group and an additional polymerizable monomer (d) | Resin solution d | Synthesized in production example 2, 20% by mass solid content, weight average molecular weight 11,800 | — |
| Polyimide resin (e) | UIP-S | Polyimide powder, 100% by weight solid content | Ube Industries, Ltd. |

(B) Phenolic Hydroxyl Group-Containing Compound

Compounds indicated in Table 2 were used for the phenolic hydroxyl group-containing compound (B) or compounds used in the comparative examples. Phenolic hydroxyl group equivalents were calculated by dividing the molecular weight or weight average molecular weight by the number of phenolic hydroxyl groups (average number in the case of oligomers and polymers) per molecule.

TABLE 2

| Name of compound | Structure | Molecular weight or weight average molecular weight | Phenolic hydroxyl group equivalent |
|---|---|---|---|
| Tris(4-hydroxyphenyl)methane | 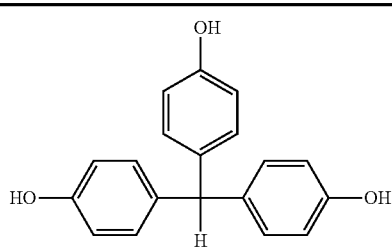 | 292.33 | 97 |

TABLE 2-continued

| Name of compound | Structure | Molecular weight or weight average molecular weight | Phenolic hydroxyl group equivalent |
|---|---|---|---|
| 1,1,1-Tris(4-hydroxyphenyl)ethane | | 306.36 | 102 |
| SN 395-CL | | 1500 | 123 |
| TRI002-CL | | 800 | 98 |
| α,α,α'-tris(4-hydroxyphenyl)-1-ethyl-4-isopropylbenzene | | 424.54 | 142 |
| BRG 558 | | 3000 | 106 |
| Succinic acid | | 118.09 | — |
| Pyromellitic acid | | 254.15 | — |

TABLE 2-continued

| Name of compound | Structure | Molecular weight or weight average molecular weight | Phenolic hydroxyl group equivalent |
|---|---|---|---|
| Pyrogallol | | 126.11 | 42 |
| BRN-595N | | 60,000 | 106 |
| TRI220-CL | | 600 | 158 |
| HE-610C-07-CL | | 605 | 185 |
| α,α'-bis(4-hydroxyphenyl)-1,4-diisopropylbenzene | | 346.47 | 173 |

(C) Radiation Sensitive Compound

A photoacid generator, either a quinone diazide compound, TPPA(4)-150DF (1,2-naphthoquinonediazide-4-sulfonic acid ester of α,α,α'-tris(4-hydroxyphenyl)-1-ethyl-4-isopropylbenzene (Toyo Gosei Co., Ltd.) or a quinone diazide compound, TS-150A (1,2-naphthoquinonediazide-5-sulfonic acid ester of a,a,a'-tris(4-hydroxyphenyl)-1-ethyl-4-isopropylbenzene (Toyo Gosei Co., Ltd.)), was used for the positive tone composition. A photo-cationic polymerization initiator, CPI-200K (a propylene carbonate solution of triarylsulfonium/special phosphorous anion salt (San-Apro Ltd.)), was used for the negative tone composition. The structure of TS-150A is shown below. The sulfonic acid esterification rate for TS-150A was approximately 50%.

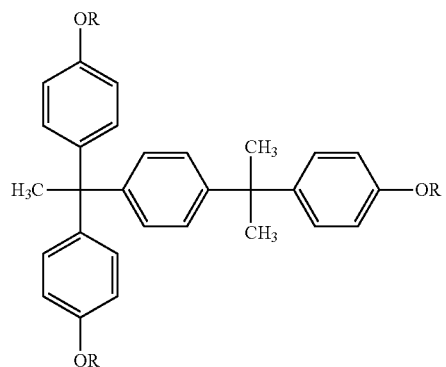

-continued

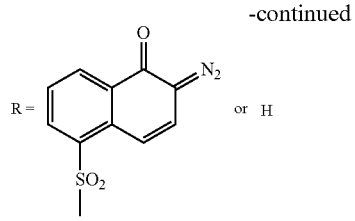

(D) Colorant

For the colorant, black dye Valifast® Black 3804 (a black dye defined by the C.I. as solvent black 34 (Orient Chemical Industries Co., Ltd.)) or black pigment, titanium black 13M (Mitsubishi Materials Electronic Chemicals Co., Ltd.) was used.

(E) Optional Component

For the surfactant (leveling agent), Megaface® F-559 (a fluorosurfactant (DIC Corporation)) was used.

(F) Solvent

For the solvent, a mixed solvent of γ-butyrolactone (GBL) and propylene glycol monomethyl ether acetate (PGMEA) was used (GBL:PGMEA=40:60 (mass ratio)).

(3) Evaluation Method

The evaluation methods used in the examples and comparative examples are described below.

[Cracks, Residue, Sensitivity, and Pattern-Clear Film Thickness]

A glass substrate (100 mm×100 mm×1 mm) was bar-coated with the photosensitive resin composition such that the dry film thickness was approximately 1.5 μm, then the solvent was dried off by heating for 80 seconds at 120° C. on a hotplate. An exposure apparatus (trade name Multilight ML-251A/B, manufactured by Ushio Inc.), in which an ultrahigh pressure mercury lamp was incorporated, was used for light exposure of 100 mJ/cm² through a bandpass filter for mercury lamp exposure (trade name HB0365 Asahi Spectra Co., Ltd.) and a quartz photomask (having a line and space (L/S) pattern of 5 μm, 10 μm, 20 μm, 50 μm, 100 μm, 200 μm, 500 μm). The amount of exposure was measured using an accumulated UV meter (trade name UIT-150, light receiving unit UVD-S365, manufactured by Ushio Inc.). A coating that was exposed to light was alkali developed for 60 seconds with a 2.38% by mass aqueous solution of tetramethylammonium hydroxide using a spin development device (AD-1200, manufactured by Takizawa Sangyo K.K.). Thereafter, the coating was cured for 60 minutes at 250° C. in a nitrogen atmosphere and a pattern sample was obtained.

With regard to cracks, observations were carried out using an optical microscope (VH-Z250, manufactured by Keyence Corporation) after alkali development. Coatings were judged to be excellent when no cracks were found over the entire substrate, good when barely any cracks were found over the entire substrate, or defective when cracks were found over the entire substrate.

With regard to residue, observations were carried out using an optical microscope (VH-Z250, manufactured by Keyence Corporation) after alkali development. When no residue was found on a coating including in the edge parts of the pattern after alkali development, the coating was judged to have "no residue". When residue was found on a coating, the coating was judged to have "residue".

With regard to sensitivity, the film thickness of the pattern after alkali development was measured using an optical film thickness measuring device (F20-NIR, manufactured by Filmetrics Japan, Inc.) and pattern-clear film thicknesses were categorized into five levels: Level 5, not less than 1.10 μm; Level 4, less than 1.10 μm and not less than 1.05 μm; Level 3, less than 1.05 μm and not less than 1.00 μm; Level 2, less than 1.00 μM and not less than 0.90 μm, and Level 1, less than 0.90.

With regard to pattern-clear film thickness, the film thickness of the pattern after alkali development was measured using an optical film thickness measuring device (F20-NIR, manufactured by Filmetrics Japan, Inc.). A larger pattern-clear film thickness means a larger difference in solubility between the exposed part and the unexposed part, i.e., higher sensitivity.

[Solubility of Unexposed Part]

A glass substrate (100 mm×100 mm×1 mm) was bar-coated with the photosensitive resin compositions such that the dry film thickness was approximately 1.5 μm and then heated on a hotplate for 80 seconds at 120° C. to dry off the solvent. The dry film thickness was measured using an optical film thickness measuring device (F20-NIR, manufactured by Filmetrics Japan, Inc.), and then the coating was alkali developed for 60 seconds with a 2.38% by mass aqueous solution of tetramethylammonium hydroxide using a spin development device (AD-1200, manufactured by Takizawa Sangyo K.K.). The film thickness after alkali development was again measured using the optical film thickness measuring device (F20-NIR, manufactured by Filmetrics Japan, Inc.) and the film thickness (μm) dissolved during development was calculated as the solubility of the unexposed part.

[OD Value after Heating]

A glass substrate (100 mm×100 mm×1 mm) was spin-coated with the photosensitive resin compositions such that the dry film thickness was approximately 1.5 μm and then heated on a hotplate for 80 seconds at 120° C. to dry off the solvent, followed by curing for 60 minutes at 250° C. under a nitrogen atmosphere to obtain a coating. The OD value of the cured coating was measured with a transmission densitometer (BMT-1, manufactured by Sakata Inx Eng. Co., Ltd.), corrected using the OD value of only glass, and converted to an OD value per μm thickness of the coating. The thickness of the coating was measured using an optical film thickness measuring device (F20-NIR, manufactured by Filmetrics Japan, Inc.).

(4) Preparation and Evaluation of Photosensitive Resin Composition

Examples 1 to 6 and Comparative Examples 1 to 7

24 parts by mass (solid component equivalent) of resin solution c was mixed with 21 parts by mass (solid component equivalent) of resin solution d and dissolved. To the resulting solution, 5 parts by mass of each phenolic hydroxyl group-containing compound (B) listed in Table 2, 21 parts by mass of the quinone diazide compound TPPA (4)-150DF, 29 parts by mass of Valifast® Black 3804, and 0.14 parts by mass of Megaface® F-559, and the mixed solvent GBL/PGMEA were added and further mixing was carried out. After visually confirming the components had dissolved, filtration using a millipore filter having a pore diameter of 0.22 μm was carried out to prepare a photosensitive resin composition with a 12% by mass solid content concentration.

Cracks, sensitivity, and solubility of unexposed part were evaluated for the prepared photosensitive resin compositions. The results are illustrated in Table 3.

TABLE 3

| | Name of compound or trade name | Molecular weight or weight average molecular weight | Phenolic hydroxyl group equivalent | Cracks | Sensitivity | Solubility of unexposed part [μm] |
|---|---|---|---|---|---|---|
| Example 1 | Tris(4-hydroxyphenyl)methane | 292.33 | 97 | Good | 4 | 0.74 |
| Example 2 | 1,1,1-tris(4-hydroxyphenyl)ethane | 306.36 | 102 | Good | 4 | 0.71 |
| Example 3 | SN 395-CL | 1500 | 123 | Excellent | 4 | 0.64 |
| Example 4 | TRI002-CL | 800 | 98 | Excellent | 3 | 0.51 |
| Example 5 | α,α,α'-tris(4-hydroxyphenyl)-1-ethyl-4-isopropylbenzene | 424.54 | 142 | Good | 3 | 0.58 |
| Example 6 | BRG 558 | 3000 | 106 | Excellent | 4 | 0.43 |
| Comparative Example 1 | Succinic acid | 118.09 | — | Defective | 5 | 0.83 |
| Comparative Example 2 | Pyromellitic acid | 254.15 | — | Defective | 4 | 1.03 |
| Comparative Example 3 | Pyrogallol | 126.11 | 42 | Defective | 4 | 0.95 |
| Comparative Example 4 | BRN-595N | 60,000 | 106 | Good | 1 | 0.23 |
| Comparative Example 5 | TRI220-CL | 600 | 158 | Excellent | 2 | 0.51 |
| Comparative Example 6 | HE-610C-07-CL | 605 | 185 | Excellent | 2 | 0.49 |
| Comparative Example 7 | α,α'-bis(4-hydroxyphenyl)-1,4-diisopropylbenzene | 346.46 | 173 | Good | 2 | 0.36 |

Examples 7 to 13 and Comparative Example 8

Photosensitive resin compositions were prepared in the same manner as in Example 1 with the compositions illustrated in Table 4. OD value after heating, residue, pattern-clear film thickness, solubility of unexposed part, and cracks were evaluated for Example 1 and the prepared photosensitive resin compositions. The results are illustrated in Table 4. The parts by mass of the compositions in Table 4 are solid component equivalent values.

TABLE 4

| | | | Example 1 | Example 7 | Example 8 | Example 9 | Example 10 | Example 11 | Example 12 | Example 13 | Comparative Example 8 |
|---|---|---|---|---|---|---|---|---|---|---|---|
| Composition [Parts by mass] | (A) Binder resin | (a) PR-56-2 | — | 43 | — | 10 | — | — | — | — | — |
| | | (b) HMPMPS | — | — | 41 | 11 | — | — | — | — | — |
| | | (c) Resin solution c | 24 | — | — | 12 | 24 | 24 | — | 25 | 26 |
| | | (d) Resin solution d | 21 | — | — | 10 | 21 | 21 | — | 23 | 24 |
| | | (e) Polyimide resin | — | — | — | — | — | — | 40 | — | — |
| | (B) Phenolic hydroxyl group-containing compound | Tris(4-hydroxyphenyl)methane | 5 | 5 | 5 | 5 | 5 | 5 | 10 | 2 | — |
| | (C) Radiation sensitive compound | TPPA(4)-150DF | 21 | 23 | 25 | 23 | 21 | — | 21 | — | 21 |
| | | TS-150A | — | — | — | — | — | 21 | — | — | — |
| | | CPI-200K | — | — | — | — | — | — | — | 21 | — |
| | (D) Colorant | VALIFAST BLACK 3804 | 29 | 29 | 29 | 29 | — | 29 | 29 | 29 | 29 |
| | | Titanium black | — | — | — | — | 29 | — | — | — | — |
| | (E) Surfactant | Megaface ® F-559 | 0.14 | 0.14 | — | 0.14 | 0.14 | 0.14 | 0.4 | — | 0.14 |

TABLE 4-continued

| | | Example 1 | Example 7 | Example 8 | Example 9 | Example 10 | Example 11 | Example 12 | Example 13 | Comparative Example 8 |
|---|---|---|---|---|---|---|---|---|---|---|
| Evaluation results | OD value after heating [/1 μm] | 1 | 1 | 1 | 1 | 1 | 1 | 1 | 1 | 1 |
| | Residue | No residue | No residue | No residue | No residue | No residue | No residue | No residue | No residue | No residue |
| | Pattern-clear film thickness [μm] | 1.06 | 1.01 | 1.00 | 1.02 | 1.01 | 1.00 | 1.03 | 1.00 | 0.94 |
| | Solubility of unexposed part [μm] | 0.74 | 0.60 | 0.65 | 0.70 | 0.90 | 0.45 | 0.50 | 0.01 | 0.32 |
| | Cracks | Good | Good | Good | Good | Good | Good | Good | Good | Defective |

INDUSTRIAL APPLICABILITY

The photosensitive resin composition according to the present disclosure can be favorably used in radiation lithography for forming barrier ribs for organic EL elements. Organic EL elements provided with barrier ribs formed by using the photosensitive resin composition of the present disclosure can be favorably used for electrical components in a display device that shows good contrast.

The invention claimed is:

1. A photosensitive resin composition for an organic EL element barrier rib comprising:
   (A) a binder resin;
   (B) a phenolic hydroxyl group-containing compound having a molecular weight of 260 to 5,000 and a phenolic hydroxyl group equivalent of 80 to 155;
   (C) a radiation sensitive compound; and
   (D) a colorant selected from the group consisting of black dyes and black pigments,
   wherein the radiation sensitive compount (C) is a photoacid generator.

2. The photosensitive resin composition according to claim 1 wherein the molecular weight of the phenolic hydroxyl group-containing compound (B) is 270 to 4,000.

3. The photosensitive resin composition according to claim 1 wherein the phenolic hydroxyl group-containing compound (B) is at least one selected from the group consisting of tris(4-hydroxyphenyl)methane, 1,1,1-tris(4-hydroxyphenyl)ethane, a,a,a'-tris(4-hydroxyphenyl)-1-ethyl-4-isopropylbenzene, a phenol novolak resin, a cresol novolak resin, a naphthalenediol phenolic resin, a salicylaldehyde phenolic resin, a triphenylmethane phenolic resin, and a biphenylaralkyl phenolic resin.

4. The photosensitive resin composition according to claim 1 comprising 0.1 parts by mass to 20 parts by mass of the phenolic hydroxyl group-containing compound (B) with respect to 100 parts by mass of the total of the binder resin (A), the phenolic hydroxyl group-containing compound (B), the radiation sensitive compound (C), and the colorant (D).

5. The photosensitive resin composition according to claim 1 wherein the radiation sensitive compound (C) is at least one photoacid generator selected from the group consisting of quinone diazide compounds, sulfonium salts, phosphonium salts, diazonium salts, and iodonium salts.

6. The photosensitive resin composition according to claim 1 wherein the binder resin (A) has an alkali-soluble functional group.

7. The photosensitive resin composition according claim 1 comprising 1 part by mass to 70 parts by mass of the colorant (D) with respect to 100 parts by mass of the total of the binder resin (A), the phenolic hydroxyl group-containing compound (B), the radiation sensitive compound (C), and the colorant (D).

8. The photosensitive resin composition according to claim 1 comprising a photoacid generator as 5 parts by mass to 50 parts by mass of the radiation sensitive compound (C) with respect to 100 parts by mass of the total of the binder resin (A), the phenolic hydroxyl group-containing compound (B), the radiation sensitive compound (C), and the colorant (D).

9. The photosensitive resin composition according to claim 1 wherein the optical density (OD value) of a cured coating of the photosensitive resin composition is at least 0.5 per μm of film thickness.

10. The photosensitive resin composition according to claim 1 wherein the binder resin (A) comprises at least one selected from the group consisting of:
    (a) a polyalkenylphenolic resin having a structural unit represented by formula (1)

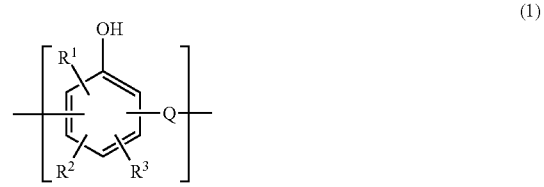

(1)

wherein in formula (1), $R^1$, $R^2$, and $R^3$ each independently represent a hydrogen atom; an alkyl group with 1 to 5 carbon atoms; an alkenyl group represented by formula (2)

(2)

wherein in formula (2), $R^6$, $R^7$, $R^8$, $R^9$, and $R^{10}$ each independently represent a hydrogen atom, an alkyl group with 1 to 5 carbon atoms, a cycloalkyl group with 5 to 10 carbon atoms, or an aryl group with 6 to 12 carbon atoms, the * in formula (2) represents the bond with the carbon atom constituting the aromatic ring; an alkoxy group with 1 or 2 carbon atoms; or a hydroxyl group, and at least one of $R^1$, $R^2$ and $R^3$ is the alkenyl group represented by formula (2), Q is an alkylene group represented by the formula $-CR^4R^5-$, a cycloalkylene group with 5 to 10 carbon atoms, a divalent organic group having an aromatic ring, a divalent organic group having an alicyclic fused ring, or a divalent group consisting of a combination thereof, $R^4$ and $R^5$ each independently represent a hydrogen atom, an alkyl group with 1 to 5 carbon atoms, an alkenyl group with 2 to 6 carbon atoms, a cycloalkyl group with 5 to 10 carbon atoms or an aryl group with 6 to 12 carbon atoms;

(b) a hydroxypolystyrene resin derivative having a structural unit represented by formula (3)

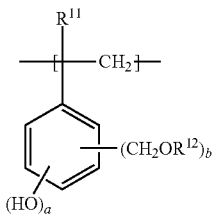

wherein in formula (3), $R^{11}$ is a hydrogen atom or an alkyl group with 1 to 5 carbon atoms, a is an integer from 1 to 4, b is an integer from 1 to 4, a+b is within the range of 2 to 5, $R^{12}$ is at least one selected from the group consisting of a hydrogen atom, a methyl group, an ethyl group and a propyl group;

(c) an aqueous alkaline solution-soluble resin having an epoxy group and a phenolic hydroxyl group; and (d) an aqueous alkaline solution-soluble copolymer of a polymerizable monomer having an alkali-soluble functional group and an additional polymerizable monomer.

11. The photosensitive resin composition according to claim 10 wherein the binder resin (A) comprises at least one selected from the group consisting of:

(c) an aqueous alkaline solution-soluble resin having an epoxy group and a phenolic hydroxyl group; and (d) an aqueous alkaline solution-soluble copolymer of a polymerizable monomer having an alkali-soluble functional group and an additional polymerizable monomer.

12. An organic EL element barrier rib comprising a cured product of the photosensitive resin composition according to claim 1.

13. An organic EL element comprising a cured product of the photosensitive resin composition according to claim 1.

* * * * *